US007232982B2

(12) United States Patent
Takami

(10) Patent No.: US 7,232,982 B2
(45) Date of Patent: *Jun. 19, 2007

(54) CRYSTALLIZATION APPARATUS, CRYSTALLIZATION METHOD, METHOD OF MANUFACTURING THIN FILM TRANSISTOR, THIN FILM TRANSISTOR, AND DISPLAY APPARATUS

(75) Inventor: Yoshio Takami, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 70 days.

This patent is subject to a terminal disclaimer.

(21) Appl. No.: 10/861,473

(22) Filed: Jun. 7, 2004

(65) Prior Publication Data

US 2005/0040146 A1 Feb. 24, 2005

(30) Foreign Application Priority Data

Jun. 11, 2003 (JP) ............................. 2003-166585
Jan. 22, 2004 (JP) ............................. 2004-013966

(51) Int. Cl.
*H01L 27/00* (2006.01)

(52) U.S. Cl. ................................. 250/208.1; 250/559.4
(58) Field of Classification Search ............. 250/208.1, 250/559.4
See application file for complete search history.

(56) References Cited

U.S. PATENT DOCUMENTS 6,653,179 B1 * 11/2003 Minegishi et al. .......... 438/166
2004/0264066 A1 12/2004 Shimizu et al.

2005/0199596 A1 * 9/2005 Takami .................. 219/121.65

FOREIGN PATENT DOCUMENTS

JP 2002-176009 6/2002

OTHER PUBLICATIONS

Mutsuko Hatano, et al., "Excimer laser-induced temperature field in melting and resolidification of silicon thin films", Journal of Applied Physics, vol. 87, No. 1, Jan. 1, 2000, pp. 36-43.
Kohki Inoue, et al., "Amplitude and Phase Modulated Excimer-Laser Melt-Regrowth Method of Silicon Thin Films-A New Growth Method of 2-D Position-Controlled Large-Grains", Journal of the Institute of Electronics, Information and Communication Engineers, vol. J85-C, No. 8, Aug. 2002, pp. 624-629.
M. Jyumonji, et al., TFTp2-10, Electrochemical Soceity, AM-LCD, pp. 153-156, "Light Intensity Distribution for Large Grain-Growth by Phase-Modulated Excimer-Laser Annealing", 2003.
U.S. Appl. No. 11/103,563, filed Apr. 12, 2005, Shimazawa et al.
U.S. Appl. No. 11/105,554, filed Apr. 14, 2005, Shimazawa et al.

* cited by examiner

*Primary Examiner*—Que T. Le
(74) *Attorney, Agent, or Firm*—Oblon, Spivak, McClelland, Maier & Neustadt, P.C.

(57) ABSTRACT

A laser crystallization apparatus and method for crystallizing a semiconductor thin film while monitoring at a high spatial and temporal resolution in real time. In a laser crystallization apparatus comprising a crystallizing optical system which irradiates a semiconductor thin film with a pulse laser light having an intensity distribution to melt and to crystallize the thin film in a manner to grow grains laterally, the apparatus comprises an illumination light source provided out of an optical path of the laser, an illumination optical system including annular optical elements which provides the optical path of the laser light in a central portion and guides the illumination light to the thin film, and an observing optical system which magnifies the illumination light transmitted through the thin film, picks up an image of the grains growing laterally, and displays the image.

18 Claims, 18 Drawing Sheets

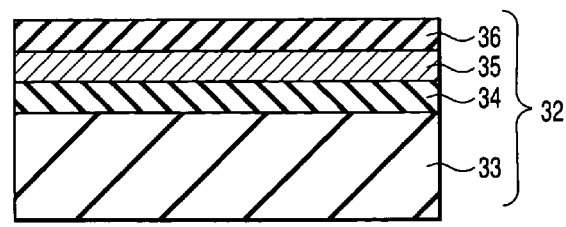
F I G. 3
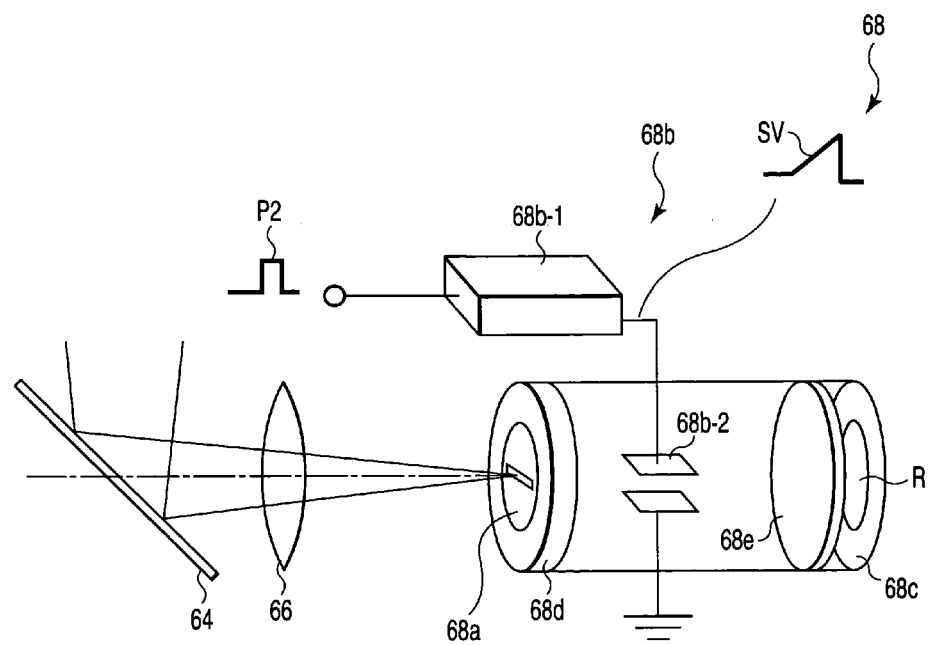
F I G. 5

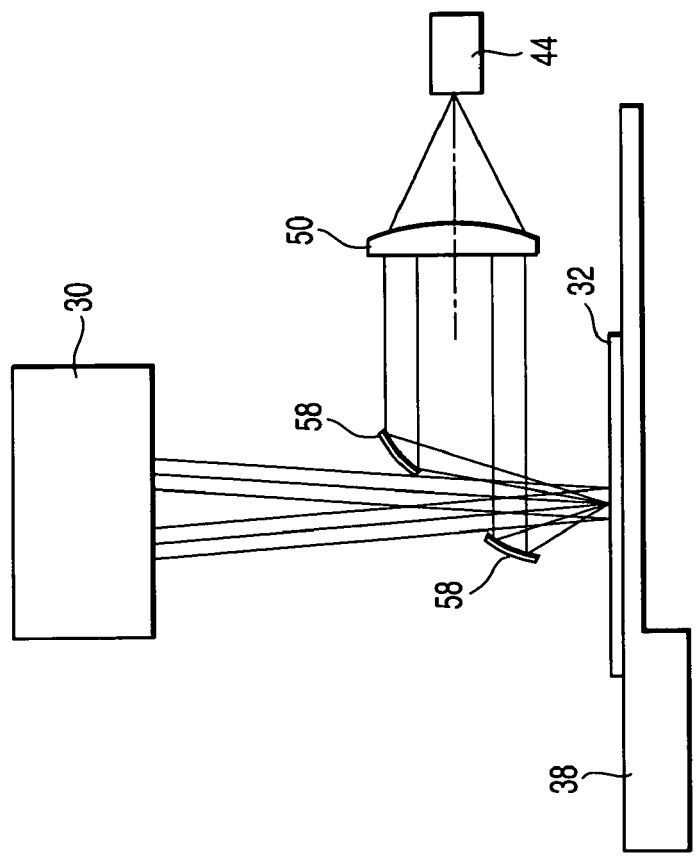
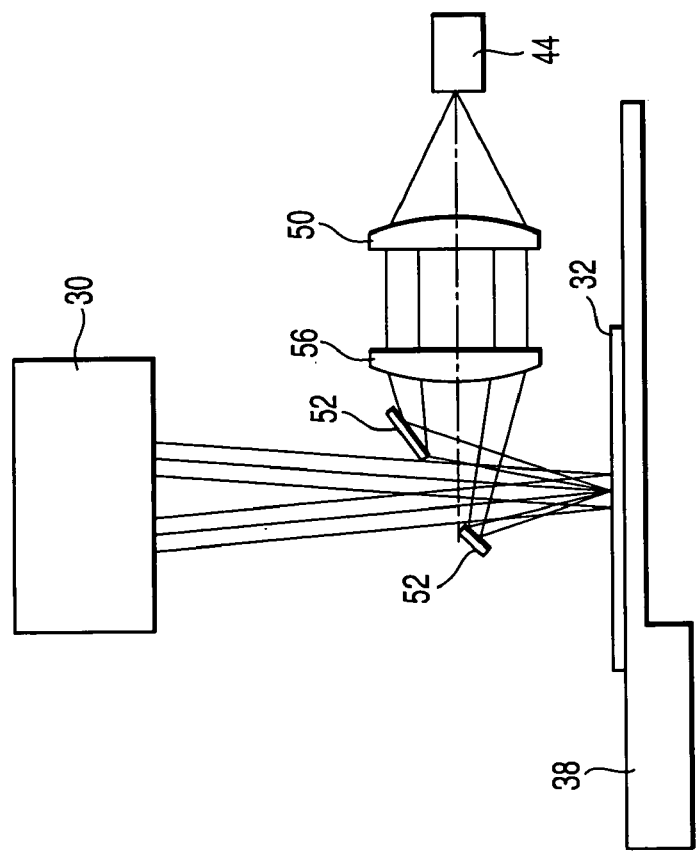
FIG. 4A
FIG. 4B

CRYSTALLIZATION APPARATUS, CRYSTALLIZATION METHOD, METHOD OF MANUFACTURING THIN FILM TRANSISTOR, THIN FILM TRANSISTOR, AND DISPLAY APPARATUS

CROSS-REFERENCE TO RELATED APPLICATIONS

This application is based upon and claims the benefit of priority from prior Japanese Patent Applications No. 2003-166585, filed Jun. 11, 2003; and No. 2004-013966, filed Jan. 22, 2004, the entire contents of both of which are incorporated herein by reference.

BACKGROUND OF THE INVENTION

1. Field of the Invention

The present invention relates to a crystallization apparatus, a crystallization method, a method of manufacturing a thin film transistor, a thin film transistor, and a display apparatus, and in particular, to a crystallization apparatus and method that enables real-time observation and monitoring a process of how a semiconductor thin film is melted and crystallized, and a method of manufacturing a thin film transistor, a thin film transistor, and a display apparatus, which are processed using a semiconductor thin film manufactured by the crystallization apparatus and method.

2. Description of the Related Art

A crystallization technique is used to crystallize a semiconductor thin film forming a thin film transistor (TFT) used in, for example, a liquid crystal display apparatus or an organic electroluminescence display apparatus; the crystallization technique comprises melting and crystallizing a semiconductor thin film using an energy beam, for example, a laser light with a high energy such as short pulse laser light. The inventor has been developing a liquid crystal display apparatus for a large screen. For example, a switching device for a pixel section in a liquid crystal display apparatus is composed of a thin film transistor. The switching device is formed in a silicon thin film crystallized so as to have a large grain size because it must be able to operate at high speed. The crystallized silicon thin film is formed by, for example, a laser crystallization technique to crystallize an amorphous silicon thin film formed on a support substrate such as a large glass substrate.

Among such crystallization techniques, a technique has been gathering much attention which carries out crystallization by applying a phase-modulated excimer laser light (i.e. Phase Modulated Excimer Laser Annealing (PMELA)). The PMELA technique is a method to melt and crystallize the silicon thin film, for example, an amorphous silicon film or a polycrystal silicon thin film, by irradiating a semiconductor thin film with a pulse excimer laser light having its phase modulated by a phase shifter and having a predetermined light intensity distribution. A crystallized silicon thin film having a large grain size can be obtained by properly controlling the crystallization process. The currently developed PMELA technique forms a high-quality crystallized silicon thin film having relatively uniform crystal grains of grain size several to about 10 µm. The crystallized silicon thin film is formed by melting and crystallizing a preset place within an area of several millimeters square in a single excimer laser light irradiating operation. The details are described in, for example, "Amplitude and Phase Modulated Excimer-Laser Melt-Regrowth Method of Silicon Thin-Films—A New Growth Method of 2-D Position-Controlled Large-Grains—" published by Kohki Inoue, Mitsuru Nakata, and Masakiyo Matsumura in Journal of the Institute of Electronics, Information and Communication Engineers, Vol. J85-C, No. 8, pp. 624–629, 2002.

Presently, in a silicon thin film having a large crystal grain size of at least several µm, one or more thin film transistors can be formed in one crystal grain. A liquid crystal display apparatus composed of the thin film transistors can playback a uniform color image over the entire surface of a large screen and perform high-speed switching. The manufacture of semiconductor thin films having such characteristics as well as crystal grains of a large grain size must be reliable, and the quality of these semiconductor thin films must be properly managed.

With the current PMELA technology, an available excimer laser light power varies by only about 5 to 10%. However, compared to the stability of the excimer laser light, a process margin for forming crystallized silicon thin films of a desired quality is very small, for example. Thus, industrializing this technology requires the process margin to be increased in order to further improve and stabilize the quality of crystallized silicon thin films. To achieve this, it has been desired to observe or monitor a changing crystallization process, how a silicon thin film is melted and crystallized in a very small area, at a high spatial resolution of several µm and a high temporal resolution on the order of nanoseconds, in real time or immediately after irradiation with a laser light.

As such an in situ observation, examples of experiments are reported by M. Hatano, S. Moon, M. Lee, K. Suzuki, and C. Grigoropoulos in J. Applied Physics, Vol. 87, No. 1, pp. 36–43, 2000, "Excimer laser-induced temperature field in melting and resolidification of silicon thin films". In the experiments, the thermal properties of silicon thin films were observed which were melted and crystallized using an excimer laser crystallization (ELA) technology and without using phase modulation. In this report, the thermal property of melted and crystallized silicon thin films was measured at a high temporal resolution on the order of nanoseconds (hereinafter referred to as nsec). Specifically, a helium-neon (He—Ne) laser light (wavelength: 633 and 1,520 nm), as a probe light for observation, is irradiated to melting and crystallizing area from obliquely above. Reflected and transmitted light beams from the melting and crystallizing area are detected by an indium-gallium-arsenic photo detector and a silicon pn photo diode to measure the thermal property of the silicon thin films.

In the PMELA, a silicon thin film is melted and then crystallized by being irradiated with a crystallizing laser light for several dozen to 100 nsec. The time required from the melting to the end of the crystallization is several 100 nsec. Furthermore, the crystallized area to be observed or monitored is very small and has a size of about several tens µm square. However, the method of M. Hatano et al. cannot determine what part of an amorphous silicon thin film has been melted, that is, the melted area in the amorphous silicon thin film. Naturally enough, temporal changes in the melted area cannot be measured either. In the prior art, if silicon thin film transistors manufactured on such unreliably evaluated silicon thin films are used as switching devices in a liquid crystal display apparatus, the switching devices may cause a failure in an electrical property.

Moreover, the method of M. Hatano et al. cannot measure positional information that is important in crystal growth (lateral growth), that is, rapid changes of at most 1 nsec in an area of about 1 µm square and changes in faint light. To realize a high-performance display by reducing the size of transistors while increasing the integration density, it is important in process development, in production, and in quality management to monitor what position of an amorphous silicon thin film is crystallized and how the crystallization progresses.

Therefore, the method of M. Hatano et al. provides a high temporal resolution but is not applicable to observation systems that simultaneously meet both a high spatial resolution of at most several μm and a high temporal resolution.

Further, in the laser crystallization, the lateral growth of an amorphous silicon thin film is estimated to progress at a speed of 7 m/sec. The currently reported crystal grain size is up to about several μm. Accordingly, to monitor the lateral growth during crystallization in real time, it is preferable to make measurements using a temporal resolution equal to a time (10 nsec or shorter, with a spatial resolution of sub μm) at least one order shorter than the time required for crystal growth:

$$10^{-6} \text{ m}/(7 \text{ m/sec}) \approx 10^{-7} \text{ sec} = 100 \text{ nsec}.$$

Moreover, time for phase transitions (solid-liquid-solid) is about 10 nsec according to data from a method of irradiating a crystallizing area with an observing illumination light or monitor light and measuring changes in the reflection from the crystallizing area. A resolution of one-tenth of 10 nsec, that is, 1 nsec is required to monitor the lateral growth during crystallization in real time. Thus, there are problems to observe or monitor the lateral growth based on the method of laser crystallization, for example, enabling to make measurements at a temporal resolution equal to a very short time of at most 1 nsec, enabling to make measurements at a high spatial resolution equal to a very small area of at most 1 μm, and enabling to measure an image with a very small quantity of light. Compared to the order of the time (seconds) and distance (m) to be measured, the quantity of light to be measured is much smaller, that is, about $10^{-9} \times 10^{-6}$. Consequently, there is a problem in the quantity of light to be observed or monitored.

The inventor has been developing a laser crystallization apparatus provided with an observation system, that is, an optical system that enables observations at a high spatial resolution of several μm and a high temporal resolution on the order of nanoseconds in real time or during or immediately after laser melting. To incorporate the observation system into the laser crystallization apparatus, it is desirable to use an optical system that simultaneously corrects aberrations in a crystallizing excimer laser light (ultraviolet light region) and an observing illumination light (visible light region).

To achieve the above objects and requirements, the problems described below must further be solved.

From a view of production efficiency, it is a prerequisite that lenses actually used in a PMELA apparatus can provide a high light intensity and a high duty and expose a large area. Specifically, the laser light intensity is preferably approximately 1 J/cm² on a substrate to be crystallized. Thus, in contrast to an exposure apparatus for a large integrated circuit using a similar excimer laser light, i.e. an aligner or a stepper, the PMELA apparatus uses the laser light without limiting its large spectral width (0.5 nm). Further, the excimer laser light used is, for example, krypton fluoride (KrF) excimer laser or xenon chloride (XeCl) excimer laser and has a wavelength of 248 or 308 nm, respectively. In view of these wavelengths of the laser light, available lens materials are limited; it is preferable to use synthetic quartz for UV grade or calcium fluoride ($CaF_2$). Furthermore, a configuration with pasted lenses such as microscope lenses for visible light is not preferable in terms of heat resistance. Accordingly, the degree of freedom is limited in designing the lenses.

Moreover, in a crystallization process using a phase modulating element, for example, a phase shifter, a substrate on which crystallization process is performed is irradiated with a laser light having a predetermined light intensity distribution. Specifically, for example, a mask pattern in the phase shifter is transferred onto the substrate at a high resolution of about several μm so that the mask pattern has a reduced or unchanged size on the substrate. Thus, the lens (lens group) used in the PMELA apparatus must undergo corrections of color aberrations, strain aberrations, or the like in the ultraviolet light region. If this single optical system is used for both excimer laser light and visible light for microscopic observations, aberrations must be simultaneously corrected in the two wavelength regions, that is, the ultraviolet light region and the visible light region. This is very difficult to achieve. For example, even if color aberrations can be successfully corrected, the number of lenses must be increased. Then, the quantity of light absorbed by the lenses increase to reduce the light intensity of the laser light reaching the substrate. This is contrary to the requirement for an increased light intensity.

Moreover, in a crystallizing optical system adapted for an excimer laser light exhibiting the previously described performance, a transmitted visible light disadvantageously has a reduced resolution. Specifically, the resolution is proportional to the wavelength of the light. Accordingly, in the case of a visible light (wavelength: 480 to 600 nm) which has a wavelength twice as large as that of an excimer laser light (wavelength: 248 or 308 nm), when the excimer laser light has a resolution of 2 μm, the visible light has a reduced resolution of about 4 μm, indicating that the minimum area that can resolved by the visible light is double that can be resolved by the excimer laser light. As a result, it is impossible to obtain a resolution of at most 1 μm, which is required to observe or monitor a crystallized area of several μm.

A temporal resolution equal to a very short time (nanoseconds) is required to observe or monitor in real time how a semiconductor thin film formed on a substrate is melted and crystallized. It is thus necessary to use a high-luminance observing illumination light source or monitor light source adapted for short-time observations. When a visible light used as an observing illumination or monitor light is applied through a large number of optical lenses for excimer laser, disadvantageously not only the quantity of light is reduced but the inherent imaging performance of the ultraviolet light is also degraded.

That is, an optical system meeting such requirements must be able to be stably used at at least two different wavelengths of an excimer laser light (wavelength: for example, 248 nm) having a high light intensity (for example, at least 1 J/cm² on the substrate), a large irradiation area (for example, at least 5×5 mm²), and a high duty (for example, a laser operation frequency of at least 100 Hz) and of an observing illumination or monitor light, for example, a visible light (wavelength: for example, 480 to 650 nm).

In the present invention, it is performed that crystallization of a semiconductor thin film by irradiating an energy beam having a predetermined intensity distribution, for example, a pulse excimer laser light having a predetermined light intensity distribution by phase modulation. The irradiated semiconductor thin film is melted then crystallized laterally controlled by energy distribution of the energy beam. The present invention makes it possible to observe or monitor how the semiconductor thin film is melted and crystallized, at a high spatial resolution of several μm and a high temporal resolution on the order of nanoseconds, in real time or immediately after the pulse laser beam irradiation. By, for example, controlling a crystallization process on the basis of the results of the observations or monitoring, the crystallization process is stabilized. It is therefore possible to provide a crystallization apparatus and method that enables a high-quality semiconductor thin film to be efficiently crystallized, a thin film transistor, a method of manufacturing a thin film transistor, and a display apparatus using the thin film transistor, which are manufactured on the semiconductor thin film using the crystallization apparatus and method.

BRIEF SUMMARY OF THE INVENTION

It is possible to solve problems described above by a crystallization apparatus and method, a thin film transistor, a method of manufacturing a thin film transistor, and a display apparatus according to the present invention.

In one aspect, in a laser crystallization apparatus comprising a crystallizing optical system which irradiates a thin film formed on a substrate with a pulse laser light having a predetermined light intensity distribution to melt the thin film and to crystallize the thin film growing grains laterally immediately after the pulse laser light irradiation, the apparatus comprises an illumination light source provided out of an optical path of the laser light to emit an observing illumination light which illuminates the thin film, an illumination optical system including an annular optical element which provides the optical path of the laser light in a central portion and guides the illumination light from the illumination light source to the thin film along the optical path, and an observing optical system which magnifies the illumination light transmitted through the substrate including the thin film, picks up an image of the grains growing laterally, and displays the image.

In another aspect, in a laser crystallization apparatus comprising a crystallizing optical system which irradiates a thin film formed on a substrate with a pulse laser light having a predetermined light intensity distribution to melt and to crystallize the thin film wherein a solid-liquid interface being moved laterally immediately after the pulse laser light irradiation, the apparatus comprises an illumination light source provided out of an optical path of the laser light to emit an observing illumination light which illuminates the thin film, an illumination optical system including an annular optical element which provides the optical path of the laser light in a central portion and guides the illumination light from the illumination light source to the thin film along the optical path, and an observing optical system which magnifies the illumination light transmitted through the substrate including the thin film, picks up an image of the solid-liquid interface moving laterally, and displays the image.

In another aspect, a laser crystallization method comprises a step of emitting a pulse laser light having a predetermined light intensity distribution, a step of irradiating a thin film formed on a substrate with the pulse laser to melt and to crystallize the thin film wherein a solid-liquid interface being moved laterally immediately after the pulse laser light irradiation, a step of illuminating an area irradiated with the laser light with an annular observing illumination light along an optical path of the laser light using an annular optical element provided coaxially around the optical path of the laser light to pass through the laser light inside, a step of magnifying and imaging the illumination light transmitted through the thin film and picking up an image of the solid-liquid interface moving laterally, and a step of displaying the picked image.

In another aspect, a laser crystallization method comprises a step of irradiating a thin film with an energy beam having a predetermined energy distribution to melt the thin film and to crystallize the thin film in a cooling process, a step of picking up an image of an area of the thin film irradiated with the energy beam or a back surface of the area, a step of converting the picked optical image into an electric signal which varies with time passes, and a step of outputting monitoring information from the electric signal for the crystallization, wherein the monitoring information is expanded in a preset first direction.

In another aspect, a laser crystallization method comprises a step of irradiating a thin film with an energy beam having a predetermined energy distribution to melt the thin film and to crystallize the thin film in a cooling process, a step of picking up an image of an area of the thin film irradiated with the energy beam or a back surface of the area, and a step of storing a picked information for the crystallization on a solid-liquid interface moving laterally.

In another aspect, a method of manufacturing a thin film transistor, wherein the thin film transistor is formed on a crystallized semiconductor thin film and, in forming the crystallized semiconductor thin film, irradiating a non single crystal semiconductor thin film with an energy beam having a predetermined energy distribution to melt the thin film and to crystallize the thin film in a cooling process, imaging the thin film being melted and crystallized by a streak camera, and crystallizing a preset area in the thin film while monitoring the crystallization.

In another aspect, a thin film transistor formed on a semiconductor thin film which is formed by irradiating a non single crystal semiconductor thin film with an energy beam having a predetermined energy distribution to melt the thin film and to crystallize the thin film in a cooling process, wherein the crystallized semiconductor thin film is formed in a preset area in the non single crystal semiconductor thin film while monitoring the thin film being melted and crystallized.

In still another aspect, a display apparatus comprises a pair of substrates joined together with a predetermined gap, and an electro optical substance held in the gap, wherein an opposing electrode is formed on one of the substrates, a semiconductor thin film is formed on the other substrate, pixel electrodes and thin film transistors driving the pixel electrodes being formed on the semiconductor thin film, wherein the semiconductor thin film is crystallized in a preset area of a non-single crystal semiconductor thin film while picking up an image of the non single crystal semiconductor thin film being melted and crystallized and monitoring the crystallization.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a sectional view showing an example of a substrate having a semiconductor thin film to be crystallized;

FIGS. 4A and 4B are views illustrating the configuration of a variation of an observing illumination optical system according to the first embodiment;

FIG. 5 is a view illustrating the configuration of a streak tube that is an example of a photo detector in FIG. 1;

DETAILED DESCRIPTION OF THE INVENTION

With reference to the drawings, description will be given of an example of the configuration of an embodiment that solves the above problems as well as applied examples.

(First Embodiment)

A laser crystallization apparatus 1 according to a first embodiment is incorporating a mechanism to observe or monitor a crystallization process of a semiconductor thin film in real time. The laser crystallization apparatus 1 irradiates a pulse excimer laser light having a predetermined light intensity distribution onto the semiconductor thin film formed on a substrate 32 to melt the semiconductor thin film. The monitoring mechanism observes or monitors, in real time, the melted semiconductor thin film to crystallize by growing a crystal grain laterally immediately after the laser light irradiation.

Figure 1:
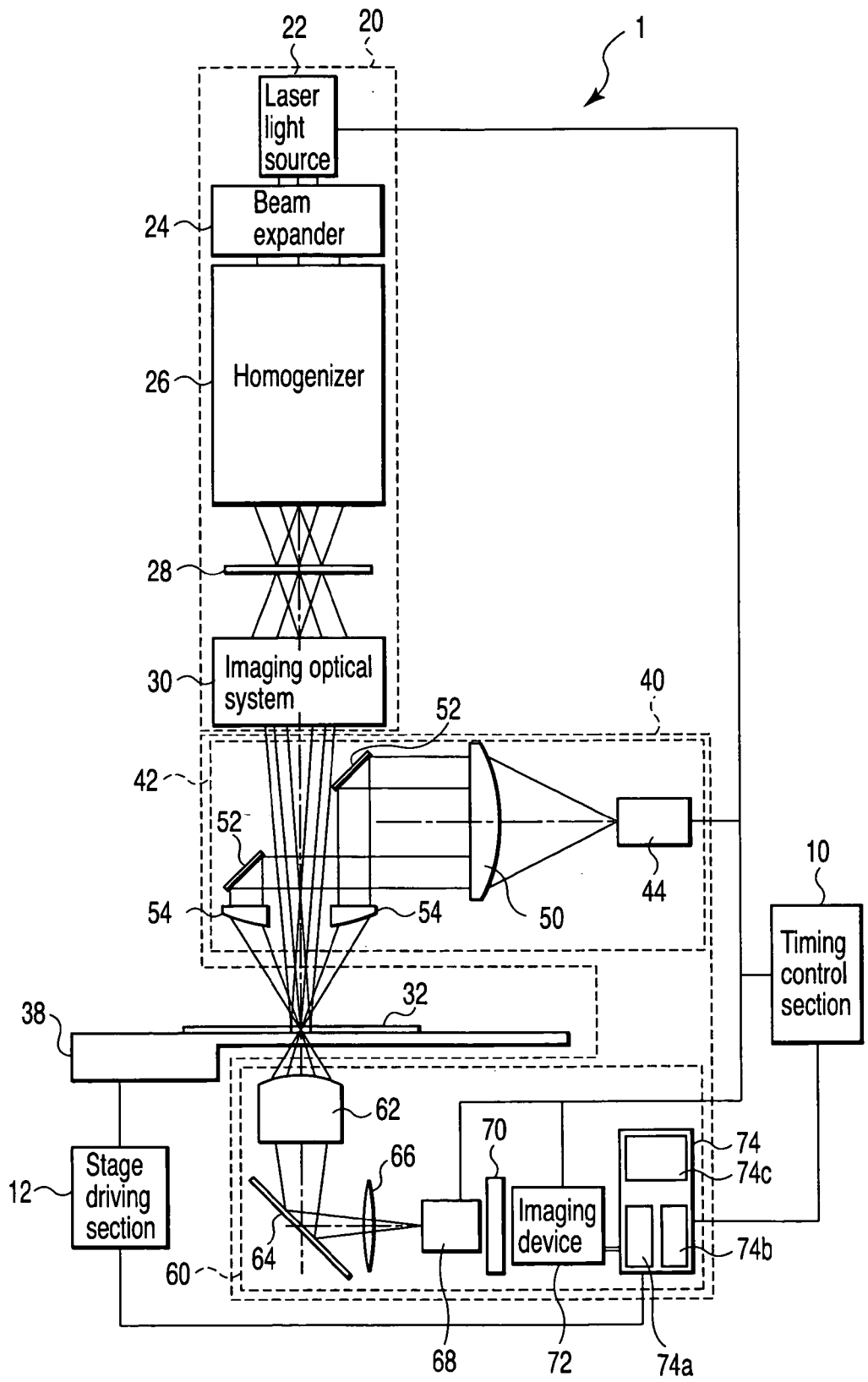
FIG. 1 is a diagram of the configuration of a crystallization apparatus illustrating an example of a first embodiment of the present invention.

As shown in FIG. 1, the laser crystallization apparatus 1 comprises a crystallizing optical system 20 and a microscopic observing system or monitoring device 40. The crystallizing optical system 20 irradiates a preset area on the substrate 32 with a laser light to melt and crystallize a semiconductor thin film formed on the substrate 32. The microscopic observing system or monitoring device 40 observes melting and crystallizing areas of the semiconductor thin film. The microscopic observing system 40 further comprises an observing illumination optical system or monitor light illuminating optical system 42 that applies an observing illumination light or monitor light and a transmission type microscopic observing optical system or monitoring section 60 that observes how the semiconductor film is melted and crystallized. The present embodiment is characterized in that since an imaging optical system 30 in the crystallizing optical system 20 has a long focal distance (50 to 70 mm), an independent observing illumination optical system 42 for, for example, a high-luminance visible light is coaxially placed in the space between the imaging optical system 30 and the substrate 32. That is, the observing illumination optical system 42 is independent of the imaging optical system 30 for crystallization.

This embodiment is an apparatus and method for laser crystallization characterized in that a change in the crystallizing area is displayed on, for example, a monitor screen 74c in real time. The change is in a μm-order area irradiated with a observing illumination light or monitor light, the change lasting only several 100 ns. With this apparatus and method, for example, an area of about 4 to 25 mm$^2$ in a semiconductor thin film formed on the substrate 32 to be crystallized is irradiated with light, for example, an pulse excimer laser light so as to be melted and solidified for crystallization.

The microscopic observing system or monitoring device 40, which picks up an image of very rapid changes in such a very fine area, is characterized in that the crystallizing optical system 20 is formed in a central axis and an annular optical system 52, 54, constituting the observation illumination optical system or monitor light irradiating optical system 42, is provided around an optical path of the crystallizing optical system 20. The annular optical system 52, i.e., an annular reflector, coaxially leads the observation illumination light to around the crystallizing laser light. And the annular optical system 54, which is preferably a single annular optical lens, focuses the annular illumination light on the substrate 32. Although it is possible to use an objective lens using multiple annular lenses, it is not practical to use it from views of optical performance and cost. This annular optical system 52, 54 enables observations and monitoring at a high spatial resolution and a high temporal resolution. Information on changes in the state of an area irradiated with a crystallizing laser light may be stored in a storage section 74b of an image processing unit 74, for example, a memory. It is possible to display the changes in the state of the irradiated area on the monitor screen 74c as a still image or a moving image, under conditions desired by a monitoring operator, for example, at a desired speed, immediately after the crystallization or in real time.

The laser crystallization apparatus 1, shown in FIG. 1, projects an image of a phase modulating element 28 in reduced size and comprises the transmission type microscopic observing system or monitoring device 40. The laser crystallization apparatus 1 also has a function to correct the level and/or in-plane misalignment of the substrate 32 to be crystallized, on the basis of the results of observations by the microscopic observing system 40.

Specifically, the laser crystallization apparatus 1 comprises the crystallizing optical system 20, which forms a crystallizing light pattern for crystallization to grow crystal grains in a large size, the observing illumination optical system or monitor light illuminating optical system 42, its main part is installed around an optical path of a crystallizing laser light to form an observing annular light, a microscopic observing optical system or monitoring section 60 that observes an area subjected to a crystallization process, a timing control section 10, and a stage driving section 12.

The crystallizing optical system 20 comprises a laser light source 22, a beam expander 24, a homogenizer 26, a phase modulating element 28, for example, a phase shifter, an imaging optical system 30, and a substrate holding stage 38 that guides the substrate 32 to a preset position. The beam expander 24 expands a pulse laser light from the laser light source 22, and the homogenizer 26 makes in-plane light intensities uniform. The laser light is then irradiated to the phase modulating element 28, for example, a phase shifter. The light transmitted through the phase shifter 28 is a modulated light having a predetermined light intensity distribution, for example, in an inverse peak pattern. The imaging optical system 30, for example, an excimer imaging optical system projects the substrate 32 with this modulated light in reduced or equal size.

The laser light source 22 outputs a laser light having energy of, for example, 1 J/cm$^2$, which is sufficient to melt a semiconductor thin film which is formed on the substrate 32 and which is not a single crystal, for example, an amorphous semiconductor thin film or a polycrystal semiconductor thin film. Preferably, the laser light is, for example, a krypton fluoride (KrF) excimer laser light having a wavelength of 248 nm or xenon chloride (XeCl) excimer laser light having a wavelength of 308 nm. Other available energy beam source may be an argon fluoride (ArF) excimer laser light, an argon (Ar) excimer laser light, a YAG laser light, an ion beam, an electron beam, or a light from a xenon (Xe) flash lamp. For example, the excimer laser light source 22 is of a pulse oscillation type having an oscillation frequency of, for example, 100 to 300 Hz and a pulse width of, for example, 20 to 100 nsec in half width. The present embodiment uses a KrF excimer laser light of half width 25 nsec. The KrF excimer laser light irradiated to the substrate 32 has a light energy of about 1 J/cm$^2$. Assuming the oscillation frequency is set at, for example, 100 Hz and for example, an area of 2×2 mm$^2$ is irradiated with the excimer laser light, when the excimer laser light is applied step by step while using the substrate holding stage 38 to move the substrate 32 at, for example, 2 mm increments, a traveling speed of the substrate 32 is 200 mm/sec.

Figure 2:
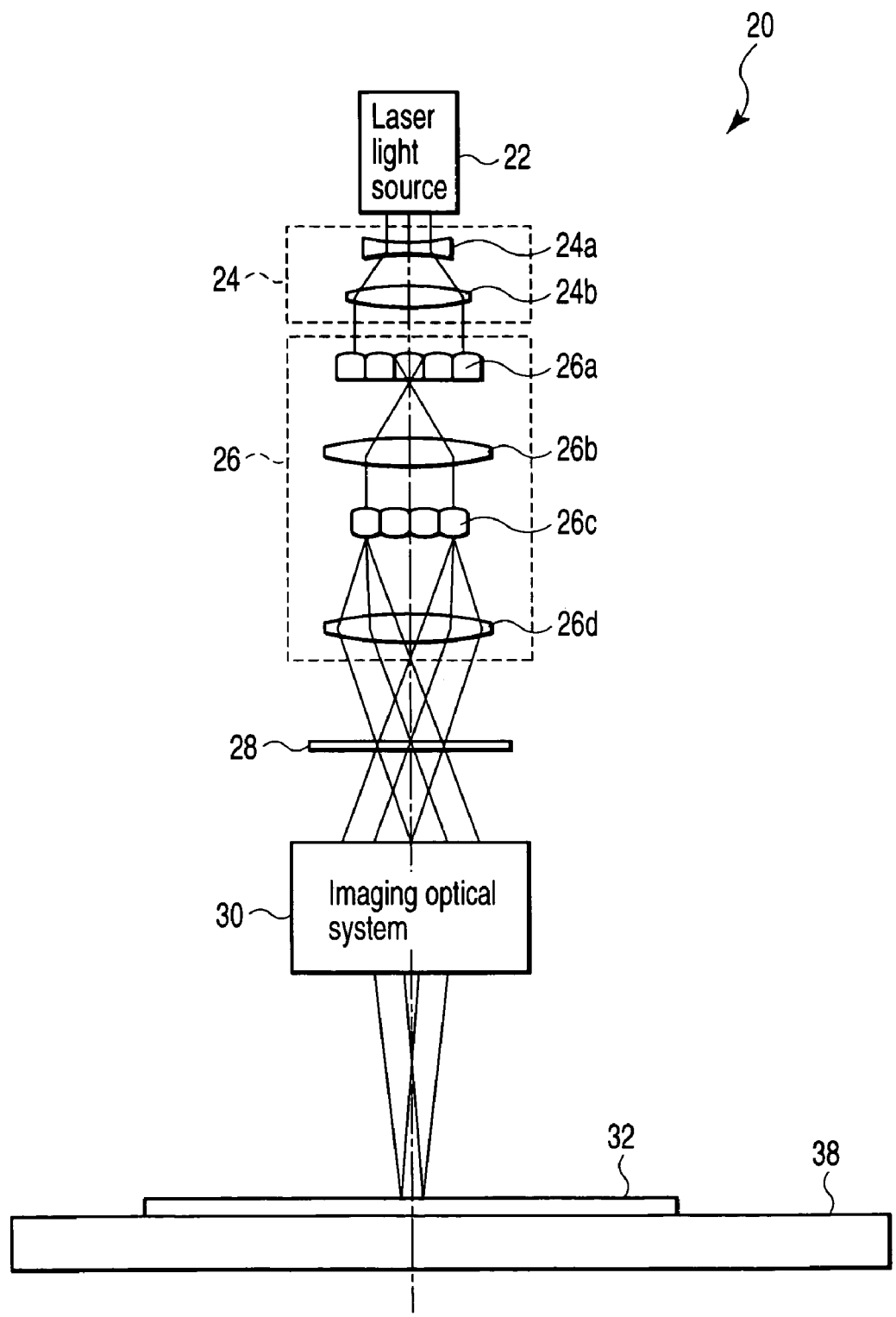
FIG. 2 is a diagram illustrating the configuration of an example of a homogenizer in FIG. 1.

The beam expander 24 expands an incident laser light. As shown in FIG. 2, the beam expander 24 is composed of a concave lens 24a for expansion and a convex lens 24b that makes incident beam parallel. The homogenizer 26 has a function to determine the dimensions of the cross section of an incident laser light in an X and Y directions and make the distribution of beam intensity uniform within the determined shape. For example, a plurality of X-direction cylindrical lenses are arranged in the Y direction to form a plurality of beams arranged in the Y direction. The X-direction condenser lenses are then used to redistribute the beams in the Y direction. Likewise, a plurality of Y-direction cylindrical lenses are arranged in the X direction to form a plurality of beams arranged in the X direction. The Y-direction condenser lenses are then used to redistribute the beams in the X direction. That is, the homogenizer 26 is composed of a first homogenizer consisting of a first fly eye lens 26a and a first condenser lens 26b and a second homogenizer consisting of a second fly eye lens 26c and a second condenser lens 26d. The first homogenizer makes uniform intensity distribution of the laser beams incident on the phase shifter 28 in Y direction. The second homogenizer makes uniform intensity distribution of the laser beams incident on the phase shifter 28 in X direction and also sets an incident angle of the laser light to the phase shifter 28. Accordingly, the KrF excimer laser light is conditioned into a laser light having a predetermined angular spread and an uniform sectional beam intensity by the homogenizer 26 then irradiates the phase shifter 28.

The phase shifter 28 is an example of the phase modulating element and is composed of, for example, a stepped quartz glass substrate. The phase shifter 28 subjects a laser light to diffraction and interference at step boundaries to create a periodical spatial distribution of laser light intensities. For example, the phase shifter 28 is provided with a lateral phase difference of 180° across a step. The phase shifter 28 with a lateral phase difference of 180° subjects an incident light to phase modulation to obtain an inverse-peak-like distribution of light intensities in line symmetry. When the wavelength of a laser light is defined as λ and the refractive index of a transparent substrate of the phase shifter is defined as n, a step (thickness difference) d is determined by d=λ/2 (n−1). On the basis of this equation, the phase shifter 28 can be manufactured by forming steps which correspond to a predetermined phase difference on the quartz glass substrate, for example. The steps on the quartz glass substrate can be formed by selective etching or FIB (Focused Ion Beam) etching. For example, given that the quartz substrate has a refractive index of 1.46, since an XeCl excimer laser light has a wavelength of 308 nm, steps of 334.8 nm are required to provide the phase difference of 180°. The phase shifter 28 has such steps as subjects an incident light to phase modulation to form an inverse-peak-like light intensity distribution. The phase shifter 28 thus shifts the phase of an excimer laser light by an amount equal to a half wavelength. As a result, the laser light irradiated to the semiconductor thin film has a light intensity distribution of a pattern with an inverse peak in which the light intensity corresponding to the phase shift part becomes minimum. This method enables a predetermined beam intensity distribution to be obtained without the need to use an excimer laser light mask such as a metal pattern as in other methods.

The aberration corrected excimer imaging optical system 30 forms an image of the laser light transmitted through the phase shifter 28 on the substrate 32, which is placed in a conjugated position with the phase shifter 28, so that the image has the predetermined light intensity distribution. The imaging optical system 30 is composed of a group of lenses consisting of, for example, a plurality of calcium fluoride (CaF$_2$) lenses and synthetic quartz lenses. The imaging optical system 30 is a long-focal distance lens having capabilities of, for example, a reduction ratio of 1/5, an NA of 0.13, a resolution of 2 μm, a depth of focus of ±10 μm, and a focal distance of 50 to 70 mm.

The imaging optical system 30 causes the phase shifter 28 and the substrate 32 to be optically conjugately arranged. In other words, the substrate 32 is placed on a plane optically conjugated with the phase shifter 28 (which is an imaging plane of the imaging optical system). The imaging optical system 30 comprises an aperture between the lenses.

As shown in FIG. 3, the substrate 32 to be crystallized generally comprises a support substrate 33, for example, a transparent glass substrate, a plastic substrate, or a semiconductor substrate (wafer) such as silicon, on which a process film 35, for example, a semiconductor thin film (for example, an amorphous silicon thin film, a polycrystal silicon thin film, a sputtered silicon thin film, a silicon germanium film, or a dehydrogenated amorphous silicon thin film) is formed via an insulating film 34, with an insulating film 36 provided on the process film 35 as a cap film. The substrate 32 used in the present embodiment is a dehydrogenated amorphous silicon thin film formed on a glass substrate to a desired thickness of, for example, 50 nm. The substrate 32 is removably held on the substrate holding stage 38, which can be moved in the X, Y, and Z directions in order to hold the substrate at a preset position.

As described above, the laser crystallization apparatus 1 is a projection type crystallization apparatus that uses the phase shifter 28 to subject a homogenized pulse laser light to phase modulation to form a crystallizing pulse laser light with an inverse-peak-like light intensity distribution and then irradiate the substrate 32 with the pulse laser light. The semiconductor thin film 35 irradiated with the pulse laser light melts then starts crystallization immediately after the pulse laser light irradiation. Specifically, the crystallization starts at a position irradiated with the lowest laser light intensity. Then a solid-liquid interface moves laterally towards an area irradiated with a higher intensity laser light. Consequently, crystal grains grow laterally in a very high speed. In this way, crystallization progresses in a horizontal direction in accordance with the predetermined light intensity distribution of the light pattern. It is thus possible to form, for example, a semiconductor thin film having single crystal grains as large as about 10 μm in size. This crystallization process progresses very fast and ends in a very short time of several hundreds nsec. The apparatus 1 comprises the microscopic observing system or monitoring device 40 in order to observe or monitor this very fast change in the moving solid-liquid interface and/or the lateral growth of crystal grains. The microscopic observing system 40 comprises the observing illumination optical system or monitor light illuminating optical system 42, which emits an observing illumination light or monitor light, and the microscopic observing optical system or monitoring section 60, used for observation and display. The microscopic observing optical system 60 is provided below the holding stage 38 to receive a light transmitted through the semiconductor thin film 35 formed on the substrate 32 in the crystallization process, in which the semiconductor thin film 35 melts and crystallizes laterally immediately after laser light irradiation. The microscopic observing optical system 60 thus microscopically observes, monitors, or measures the crystallization process in real time. (See FIG. 1) A composite optical system in which a part of the crystallizing optical system 20 overlaps a part of the observing illumination optical system 42 is provided above the holding stage 38 so that the microscopic observing optical system 60 can carry out observations, monitoring, or measurements.

In the observing illumination optical system or monitor light illuminating optical system 42, the observing illumination light or monitor light is guided to the annular optical system, installed between the imaging optical system 30 and the substrate 32 as shown in FIG. 1, and does not pass through the crystallizing optical system 20. The observing illumination optical system 42 makes the observing illumination light annular to illuminate the substrate 32. The optical path of the crystallizing laser light is formed around the central axis of the annular optical system. The composite optical system enables the simultaneous execution of a crystallization process and a crystallization observing process without interference with each other. The annular observing illumination light enables observations, monitoring, or measurements at a high spatial resolution and a high temporal resolution.

As exemplarily shown in FIG. 1, the observing illumination optical system or monitor light illuminating optical system 42 comprises a high-luminance observing illumination light source 44, a beam expander 50, an annular reflector 52, and an annular condenser lens 54. Specifically, the optical path in the observing illumination optical system 42 is provided by the annular optical system 52 and 54, each having a window hole, through which an excimer laser light is passed in order to avoid masking the optical path of the laser light as described above.

The beam expander 50 expands observing illumination light beams or monitor light beams from the high-luminance observing illumination light source 44 to obtain parallel light beam. Then, the annular optical system, composed of the annular reflector 52 and the annular condenser lens 54, converts the beam into annular observing illumination light beam. The annular observing illumination light travels along the optical path of a crystallizing laser light, and illuminates the substrate 32 from the same side with the crystallizing laser light at an angle of 7.5°, for example, from a perpendicular. The annular observing illumination light convergently illuminates the substrate 32 from outer side of the crystallizing laser light. That is, the annular observing illumination light illuminates a crystallizing area in the crystallization process. The crystallizing area is an area that is irradiated with a crystallization laser light to progress a melting process to a solidification process, followed by completion of crystallization.

The high-luminance observing illumination light source 44 has a very high light intensity in order to enable observations at a temporal resolution on the order of nanoseconds. The high-luminance observing illumination light source 44 may be, for example, a xenon (Xe) flash lamp or a light source emitting an Ar laser light, a helium-neon (He—Ne) laser light, or the like. In the present embodiment, an Xe flash lamp having a pulse width of 2 μsec and a power of 60 W is used. When a laser light is used as a light source, a homogenizer (not shown) is preferably used in order to make the distribution of light intensities within the cross section of the laser light uniform. The beam expander 50 and the condenser lens 54 can preferably be composed of a small number of lenses in order to suppress a loss caused by the absorption or reflection of the illumination light or monitor light. For example, aspheric lens may be used. The annular reflector 52 and the annular condenser lens 54 must be annular. However, the beam expander 50 need not necessarily be an annular lens. The size of the window hole in the annular reflector 52 may be as large as to pass through a diameter of 12 mm of the laser light when the reflector 52 is placed 25 mm above the substrate 32, if given that, for example, up to about 5×5 mm area on the substrate 32 can be irradiated with a crystallizing laser light and an incident angle of the crystallizing laser light to the substrate 32 is expected to about 7.5°. The annular reflector 52 and the annular condenser lens 54 may be shaped like rings or polygons.

The observing illumination optical system or monitor light illuminating optical system 42 may be differently configured and used. For example, as shown in FIG. 4A, the condenser lens 56 may be installed out of the optical path of a crystallizing laser light, for example, an excimer laser light, and between the beam expander 50 and the annular reflector 52. This configuration enables the annular reflector 52 to be installed close to the substrate 32. It is thus possible to reduce the size of the window hole, through which the crystallizing laser light is passed. In this case, the annular condenser lens 56 can be without hole since it is placed out of the optical path of a laser light.

Alternatively, as shown in FIG. 4B, an annular concave mirror (reflector) 58 having a function corresponding to a combination of the annular reflector 52 and annular lens 54 in FIG. 1 may be employed as an annular optical element. In this case, the number of optical elements can be reduced by one to that in the configuration of FIG. 1.

Now, with reference to FIG. 1, description will be given of the microscopic observing optical system or monitoring section 60, which picks up and displays images indicating crystallization process states. The microscopic observing optical system 60 comprises a microscopic objective lens 62 that magnifies and images a transmitted observing illumination light or monitor light, or an observing light, which is transmitted through the crystallizing area, a reflector 64 provided on the optical path of an observing light from the objective lens 62 to change direction of the optical path, an imaging lens 66 that forms the observed light into an image, a photo detector or reflected light measuring instrument 68 as a mean to detect and display the changing image of the crystallization process area formed through the objective lens 62 and imaging lens 66, an image intensifier 70, an imaging device 72, and an image processing unit 74.

When a melted semiconductor thin film 35 (for example, an amorphous silicon thin film or a polycrystal silicon thin film) formed on the substrate 32 is melted, the thin film 35 becomes metallic and does not transmit a visible light. On the other hand, an unmelted and a solidified silicon thin film allows a red visible light to transmit fairly well. The method for executing observation using a transmitted light provides a high contrast and is suitable for observing how the semiconductor thin film 35 is melted and crystallized. Moreover, in the transmission type microscopic observing optical system 40, when the observing illumination light or monitor light is irradiated almost perpendicular to the substrate from the same side as that of the crystallizing laser light, the microscopic objective lens 42 provided below the substrate 32 has an advantage because a central portion of the lens can be used.

In the microscopic observing optical system or monitoring section 60, a transmitted light from the substrate 32 is collected by the microscopic objective lens 62 then reflected by the reflector 64. The imaging lens 66 then forms an image of the reflected light on a photoelectric surface 68a at a high resolution of several μm. The photoelectric surface 68a is a light receiving surface of the photo detector or reflected light measuring instrument 68. A slit-like light receiving window is formed on the photoelectric surface 68a of the photo detector 68 to observe crystallization process, which changes at high speed. The slit-like photoelectric surface 68a is a rectangle of, for example, width several mm and length several cm. The photo detector 68 multiplies the number of photoelectrons converted by the photoelectric surface 68a corresponding to an incident image to form a high-resolution image on a fluorescent screen 68c of the photo detector 68. The image intensifier 70 then multiplies further the luminance of the high-resolution image on the fluorescent screen 68c of the photo detector 68. The imaging device 72 then picks up the high-resolution image as image data. The image processing unit 74 then subjects the image data to signal processing. This signal processing includes, for example, the analysis and storage of the image data and the display of the image data in the display section 74c.

The photo detector or reflected light measuring instrument 68 is preferably a phototube such as the one shown in FIG. 5, for example, a streak camera. The streak camera 68 may be, for example, a streak tube that can convert an incident light image into photoelectrons then convert the photoelectrons back into a optical image again, and can be changed a one-dimensional image at a high temporal resolution of several nanoseconds as a function of time. The general streak tube 68 is a vacuum tube for a specified application and is configured, for example, as shown in FIG. 5. An image of the incident light is received by the slit-like photoelectric surface 68a. The slit-like image is a one-dimensional image from an area in the crystallization process. The photoelectric surface 68a converts the one-dimensional image of the incident light into photoelectrons. The photoelectron beam generated by the photoelectric surface 68a passes a sweep electrode 68b-2. The sweep electrode 68b-2 is provided with a pair of spaced electrodes in order to sweep the photoelectron beam in an X or Y direction. A sweep circuit 68b-1 applies a sweep voltage SV to the sweep electrode 68-2. The sweep circuit 68b-1 supplies the sweep electrode 68b-2 with the temporally varying sweep voltage SV (see FIGS. 5 and 6) at a timing controlled by a trigger signal P2 (see FIGS. 5 and 6) from the timing control section 10 (see FIG. 1). When the photoelectron beam passes the sweep electrode 68b-2, the photoelectron beam is bent depending on a temporally varying sweep voltage to form a projected image R on a fluorescent surface 68c of the streak tube 68. The projected image R of the photoelectron beam is displayed at a position on a fluorescent surface 68c which varies with the time. The projected image R is a two-dimensional image obtained by temporally sweeping the one-dimensional slit-like image, that is, a high-resolution image that represents nanosecond-order temporal variation in the image received by the photoelectric surface 68a, as a variation in the position on the fluorescent surface 68c. To improve the sensitivity of the streak tube 68, at least either an acceleration electrode 68d or an electron multiplier 68e can be incorporated into the streak tube 68.

The image intensifier 70 further multiplies the luminance of the high-resolution two-dimensional image formed on the fluorescent surface 68c of the streak tube 68 to form an intensified high-resolution two-dimensional optical image. Specifically, the image intensifier 70 has the functions described below though it is not shown. The imaging lens of the image intensifier 70 picks up the high-resolution optical image obtained by the streak tube 68, then forms an intensified high-resolution image on the photoelectric surface of the image intensifier 70. The photoelectric surface is formed on an inner wall of a vacuum container. Photoelectrons emitted from the photo-electric surface are accelerated, converged, and reduced in size by an electron lens formed in the vacuum container to project a fluorescent surface of the image intensifier 70. The fluorescent surface displays an image having its luminance multiplied by the acceleration and reduction.

The imaging device 72, for example, a two-dimensional CCD imaging device picks up the two-dimensional multiplied optical image displayed on the fluorescent surface of the image intensifier 70, to convert it into image data. The CCD imaging device 72 preferably suppresses a dark current to improve an S/N ratio because an image to be picked by the CCD device has a very small light quantity. Thus, a cooled CCD imaging device used at low temperature (for example, between minus several dozen ° C. and a liquid nitrogen temperature) is preferable.

The image data from the CCD imaging device 72 is processed and stored under the control of the image processing unit 74, for example, a control circuit 74a in a personal computer. The data processing comprises, for example, determining the width of a crystallized area after a predetermined time has passed from the laser light irradiation. The image data and computed data are displayed in the display section 74c as required, at the same time they are stored in the storage section 74b, for example, a memory. A person in charge of the crystallization process may use the data displayed on the display section 74c to monitor the progress of crystallization. Moreover, since the image data is stored in the storage section 74b, a desired image can be extracted as a still or slow moving image and displayed in the display section 74c under the control of the control circuit 74a. The microscopic observing optical system or monitoring section 60 enables to carry out required observations or monitoring at a high temporal resolution on the order of nanoseconds and a high spatial resolution of several µm by configuring the observation system 60 as described above.

Figure 6:
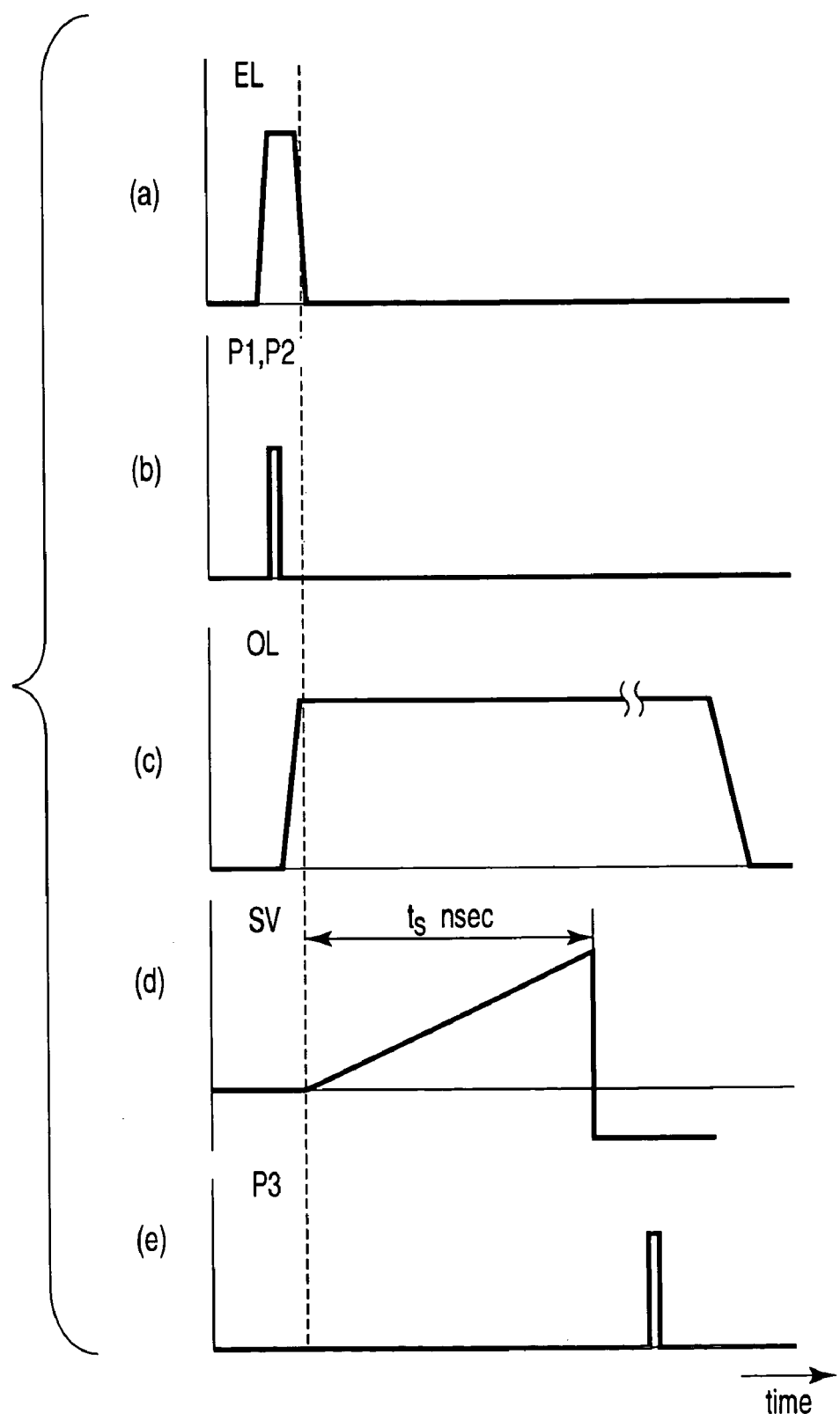
FIG. 6 is a graph illustrating an example of operational timings used to observe a semiconductor thin film being melted and crystallized using the apparatus shown in FIG. 1.

The laser crystallization apparatus 1 is provided with the timing control section 10. The timing control section 10 performs various types of timing control on, for example, the crystallizing laser light source 22, the observing illumination light source 44, and the microscopic observing optical system or monitoring section 60. Examples are shown in FIG. 6. The timing control section 10 sends trigger signals P1 and P2 (FIG. 6(b)) to the observing illumination light source 44 and a sweep voltage generator 68b, respectively, so as to start emitting with an observing illumination light or monitor light OL and application of the sweep voltage SV to the streak tube 68 when the irradiated pulse of a crystallizing laser light EL (FIG. 6(a)) falls. Upon receiving the trigger signal P1, the observing illumination light source 44 emits the observing illumination light OL (FIG. 6(c)). Upon receiving the trigger signal P2, the sweep voltage generator 68b of the streak tube 68 instructs the sweep circuit 68b-1 to generate the temporally varying sweep voltage SV (FIG. 6(d)) for a time period $t_S$. The sweep voltage generator 68b thus applies the sweep voltage SV to the sweep electrode 68b-2. After the application of the sweep voltage SV, the timing control section 10 sends a trigger signal P3 to the imaging device 72. The imaging device 72 then picks up the two-dimensional image on the fluorescent surface of the image intensifier 70 as image data.

Figure 7:
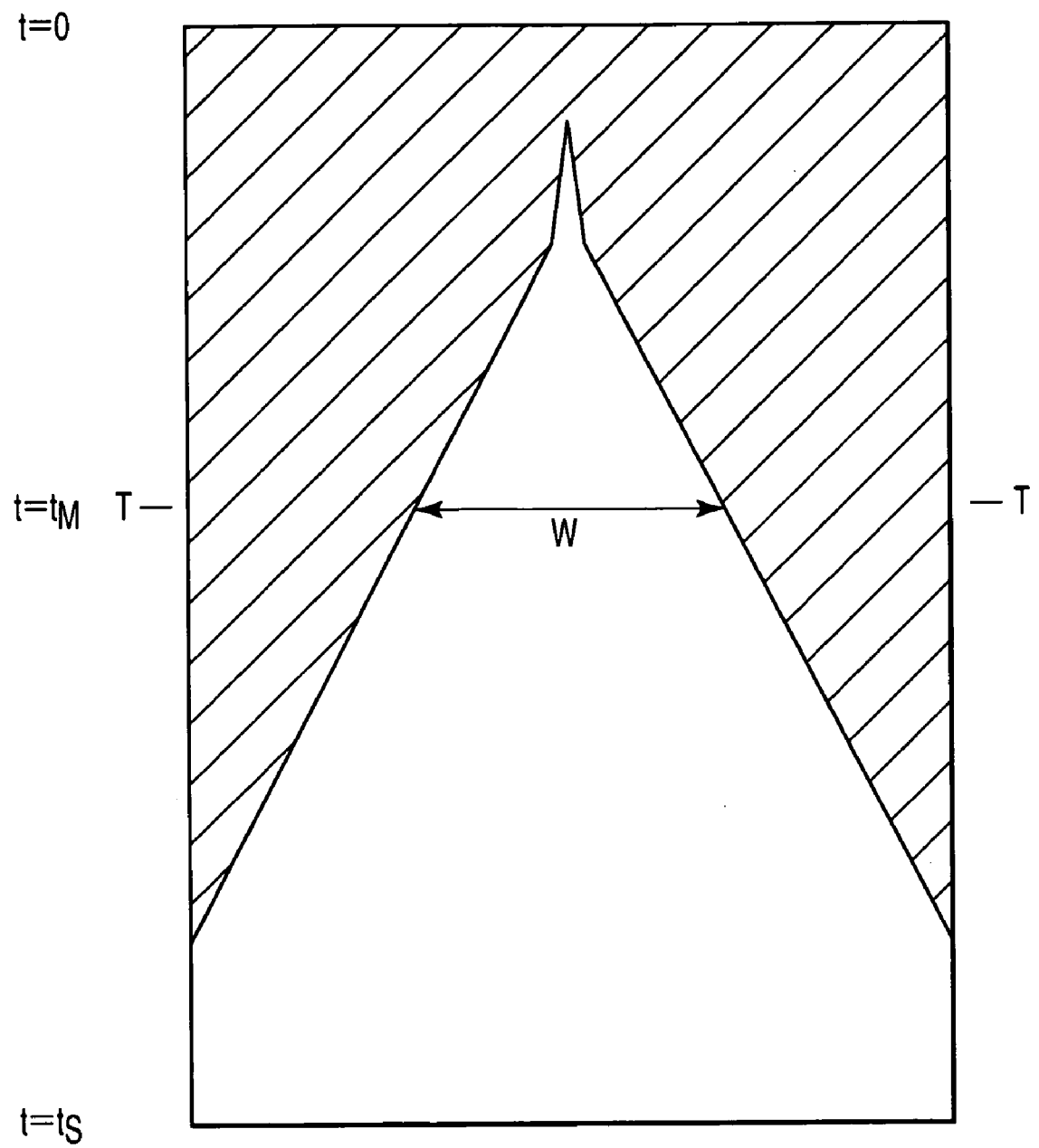
FIG. 7 illustrates an example of an image displayed on a display section of a microscopic observing optical system in FIG. 1.

For example, FIG. 7 shows an example of image data obtained by the observation described above. This image data has been obtained by observing a crystallization process of the semiconductor thin film 35. The substrate 32 to be crystallized is irradiated with a phase-modulated crystallizing laser light having an inverse-peak-like distribution of light intensities. As a result, the irradiated area in the semiconductor thin film 35 on the substrate 32 is melted. The melt temperature has an inverse-peak-like temperature distribution, which is low in a central portion and higher in the both sides of the central portion corresponding to the intensity distribution of the irradiated laser light. When the irradiation with the crystallizing laser light is finished, the temperature of the irradiated area lowers. The temperature gradient during cooling also corresponds to the inverse-peak-like light intensity distribution. A front end position of solidification, or crystallization, moves in a lateral direction in accordance with the controlled temperature gradient. The imaging device 72 of the microscopic observing optical system or monitoring section 60 picks up an image indicating the process of crystallization by simultaneously irradiating the crystallization process area with an observing illumination light or monitor light emitted by the observing illumination light source 44. This enables the crystallization to be observed or monitored. The observation comprises, for example, observing how the semiconductor thin film is crystallized. The measurement comprises, for example, measuring the size of a crystallized area.

In FIG. 7, the width of the image is magnified partly and is, for example, 10 µm, though it is actually several 100 µm or more. The height of the image corresponds to the time for which the sweep voltage SV is applied, for example, $t_S$=300 nsec. When melted, the amorphous silicon thin film 35 becomes metallic and does not transmit a visible light. Thus, a melted area becomes a dark image, whereas a crystallized area becomes a bright image because it transmits a visible light. In FIG. 7, a shaded area indicates a melted area in the silicon thin film, whereas a white area indicates a crystallized or solidified area. The upper end of FIG. 7 corresponds to a time immediately after melting, and the image entirely appears dark (shaded area). A bright crystallized area spreads from the center as the time passes, and the crystallization progress is shown towards the bottom of FIG. 7. The center of a visual field is aligned with the part corresponding to where the phase shifter 28 changes the phase of a KrF excimer laser light. In this part, since the phase of the KrF excimer laser light is reversed on the opposite sides, the reversed phases interfere with each other to substantially reduce the intensity of the excimer laser light (ideally to zero). Thus, in this part, the temperature after melting is lowest and the formation of a crystal nucleus for crystallization of the silicon thin film is created. Subsequently, crystal grains grow in the lateral direction in accordance with the temperature gradient of the melted part. Accordingly, the crystallized area (shaded area) becomes wider towards the bottom end of the figure as the time passes. Crystal grains crystallized by the PMELA apparatus according to the present embodiment have a grain size of, for example, about 6 µm.

(First Application Example of First Embodiment)

An example of application of the result of the observation of a crystallization process is the correction of a misalignment of the substrate 32 surface to a level of an imaging position of the imaging optical system 30. The misalignment of the level of the imaging position occurs for several reasons to be described below. When the surface of the substrate 32 is not aligned with the position at the imaging position of the crystallizing laser light, i.e., excimer laser light, the laser light intensity of the phase reversed part cannot be sufficiently reduced. Thus, the temperature of the phase reversed part after melting is higher than in the case in which the substrate 32 is at the imaging position. This causes a delay in the formation of a crystal nucleus and thus the start of crystallization delays. In addition, the crystal nucleus is created not only in the laser light phase reversed part but also in other parts randomly. Thus, growing crystal grains often collide against one another, and the grown crystal grains have reduced grain sizes. That is, the crystallized polycrystal silicon thin film has a degraded quality.

The imaging position of the crystallizing laser light, for example, an excimer laser light could change during a crystallization process because, for example, the substrate 32 is not flat enough, the substrate 32 with a large area is held and thus deflected, or the imaging position of the imaging optical system 30 is shifted by own temperature change. The imaging optical system 30 has its temperature changed (raised) when an excimer laser light with a high energy is applied. For example, the imaging position is shifted by, for example, 10 µm, when the temperature of a imaging optical system changes by 1° C. In view of the fact that the depth of the focus in the imaging optical system 30 is, for example, ±10 µm, this misalignment is not negligibly small.

Figure 8:
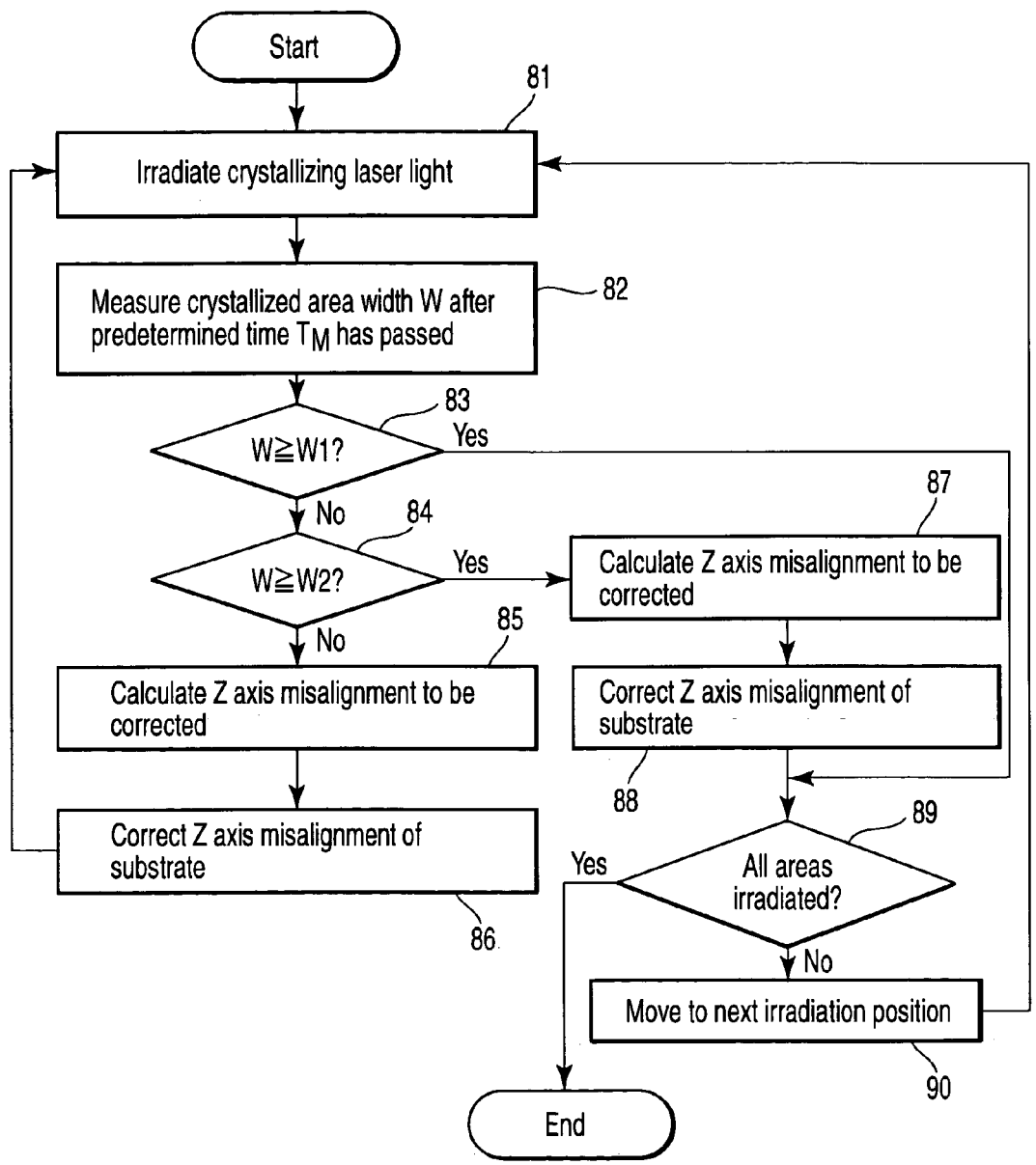
FIG. 8 is a flow chart illustrating an example of a process of correcting a vertical misalignment of the substrate with respect to an imaging position according to the first embodiment.

FIG. 8 is a flow chart of an example of a process of correcting the misalignment of the substrate 32 surface to the imaging position of the imaging optical system 30. At step 81, the substrate 32 is irradiated with a crystallizing excimer laser light to melt the silicon thin film 35. Synchronously, an observing illumination light or monitor light illuminates the melted area in the silicon thin film 35 at a timing controlled by the timing control section 10. Thus, the observation or monitoring of a crystallization process is started. At step 82, the image processing unit 74 measures the width W of a crystallized area when a predetermined time $t_M$ has passed since the irradiation of the substrate 32 with the excimer laser light. Specifically, when the time $t_M$ has passed, as shown by T—T in the center of FIG. 7, the width W of the crystallized area (white area) is measured. The measured width W is compared with a predetermined width W1 at step 83. If the width W is larger than the width W1, it is determined that the crystallization is progressing favorably. The process thus proceeds to step 89. At step 89, it is determined whether or not the process has been performed to all the areas to be crystallized on the substrate 32. If not all the areas to be crystallized have been processed, then the substrate 32 is moved to the next position to be irradiated with a crystallizing laser light, at step 90. The process then returns to step 81. If the measured width W is smaller than the width W1, then at step 84, it is compared with another predetermined width W2. The width W2 corresponds to an allowable lower limit on the quality of the crystallized semiconductor thin film 35. If the width W is larger than the width W2, it is determined that the crystallization process is within the allowable range. However, the next irradiation with an excimer laser light is carried out after the height of the substrate 32 has been corrected through steps 87 and 88. At step 87, the height of the substrate 32, that is, an amount of misalignment, to be corrected in the Z axis direction is calculated from the results of the observation as described later. At step 88, the stage driving section 12 corrects the height of the substrate 32 by the calculated misalignment correction amount. The process then proceeds to step 89. If the measured width W is smaller than the width W2 at step 84, it is determined that crystal grains have not grown large enough. Accordingly, through steps 85 and 86, the height of the substrate 32 is similarly corrected as through steps 87 and 88. The process then returns to step 81 to reirradiate that area with a laser light.

At steps 85 and 87, the amount of the height of the substrate 32 to be corrected is calculated as described below. The image processing unit 74 prestores a set of images corresponding to given misalignment amounts in the direction of the Z axis of the substrate 32 (Z-axis misalignment amounts). On the basis of an observed image pattern of the crystallized silicon thin film 35 and the stored misalignment image patterns, the image processing unit 74 uses a pattern recognition technique to calculate a Z-axis misalignment amount of the substrate 32 from a right imaging position. The calculated Z axis misalignment amount is inputted to the stage driving section 12. At steps 86 and 88, the stage driving section 12 drives the substrate holding stage 38 on the basis of the Z-axis misalignment amount to correct the position of the substrate 32 in its height (Z axis) direction. Thus, the silicon thin film 35 is aligned with the right imaging position of the excimer laser light.

(Second Application Example of First Embodiment)

Another example of application is to correct the misalignment of the in-plane position, that is, X-Y position of the substrate 32, using the laser crystallization apparatus 1 according to the present embodiment for observing a two-dimensional image of an area irradiated with an excimer laser light. The method of crystallization using a excimer laser light having an inverse-peak-like light intensity distribution formed by a phase shifter 28 is characterized in that the position at which crystal grains are formed can be predicted. For this observation, the microscopic observing optical system or monitoring section 60 is placed so that the photo detector 68 and the image intensifier 70 or only the photo detector 68 are/is temporarily withdrawn from the optical path of the imaging lens 66, while the imaging device 72 or the image intensifier 70 is moved to the position at an imaging position of the imaging lens 66. Thus, a two-dimensional image of the area in the crystallization process can be picked up.

Figure 9:
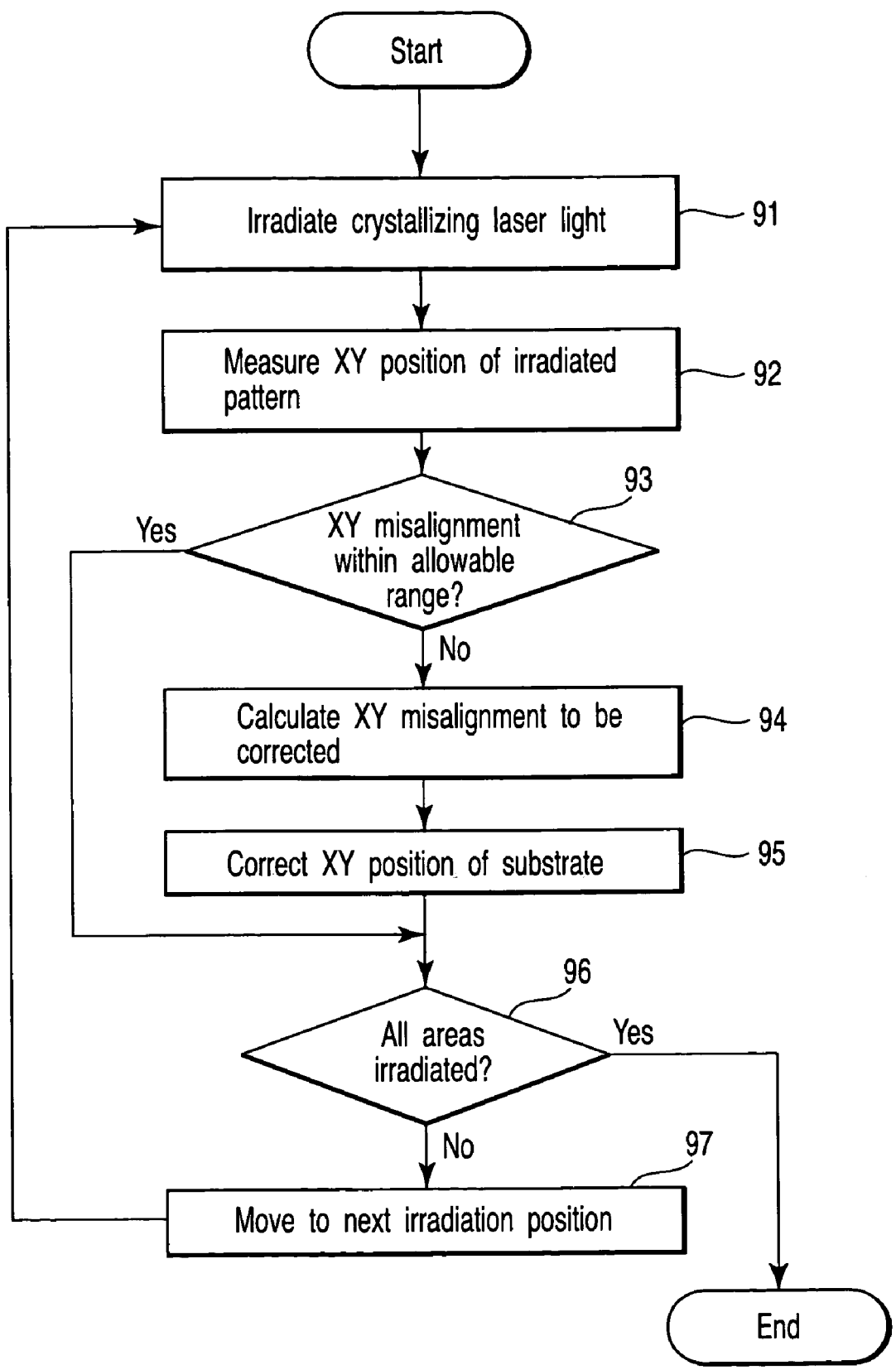
FIG. 9 is a flow chart illustrating an example of a process of correcting an in-plane misalignment of the substrate according to the first embodiment.

Description will be given of a method for correcting the X-Y position of a substrate 32 using the above configuration of the observing optical system 60. FIG. 9 is a flow chart of an example of a process of correcting X-Y direction of the substrate 32. The correction in the X-Y direction can be carried out as described below. For example, the substrate 32 is installed at a predetermined position on the X-Y-Z holding stage 38 with an alignment mark. After a fine alignment using this alignment mark as a reference, a crystallization process can be executed. At step 91, the substrate 32 is irradiated with a crystallizing excimer laser light to melt the silicon thin film 35. At step 92, a two-dimensional image of the area irradiated with the excimer laser light is picked up at any time during the crystallization process. The X and Y positions of the irradiation pattern are then measured. It is determined at step 93 whether the misalignment between the irradiation pattern and the alignment mark is within the allowable range. If the misalignment is within the allowable range, the process proceeds to step 96. If the misalignment is out of the allowable range, then at step 94, the image processing unit 74 automatically calculates a misalignment correction amount with respect to the alignment mark. Then at step 95, the misalignment of the substrate 32 in the X-Y direction is corrected through the stage driving section 12. At step 96, it is determined whether or not the process has been performed on all the areas on the substrate 32 to be crystallized. If not all the areas to be crystallized have been processed, then at step 97, the substrate 32 is moved to the next position to be irradiated with a crystallizing laser light. The process then returns to step 91.

The crystallization process is displayed on the display section 74c. The alignment performance can be displayed and checked on the screen. This misalignment correction may be automatically executed for fine tuning every time after the crystallizing laser light irradiation. The result of the misalignment correction using the alignment mark may be fed to a subsequent lithography process.

(Variation of First Embodiment)

Figure 10:
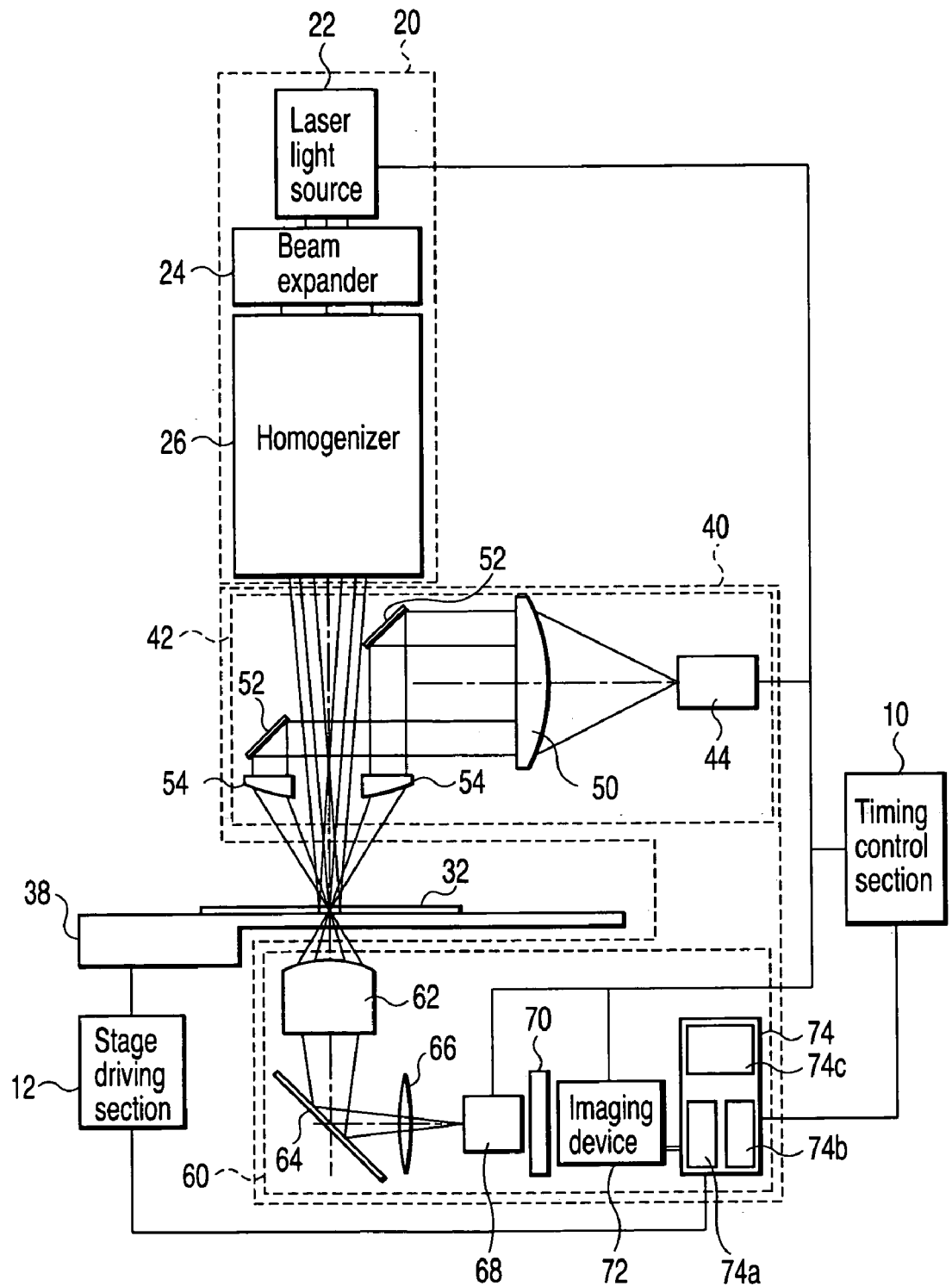
FIG. 10 is a diagram illustrating the configuration of a variation of the crystallization apparatus according to the first embodiment.

FIG. 10 shows a variation in the configuration of the first embodiment. In this variation, the phase shifter 28 and the imaging optical system 30 are removed from the configuration shown in FIG. 1, with the substrate 32 placed at a imaging position of a homegenizer 26. The present variation can reduce the number of optical elements such as lenses compared to the embodiment shown in FIG. 1. It is thus possible to apply a crystallizing laser light of an increased intensity.

The microscopic observing optical system or monitoring section 60 may not only be configured as previously described but may also be partly omitted or configured differently from the previously described one.

Figure 11:
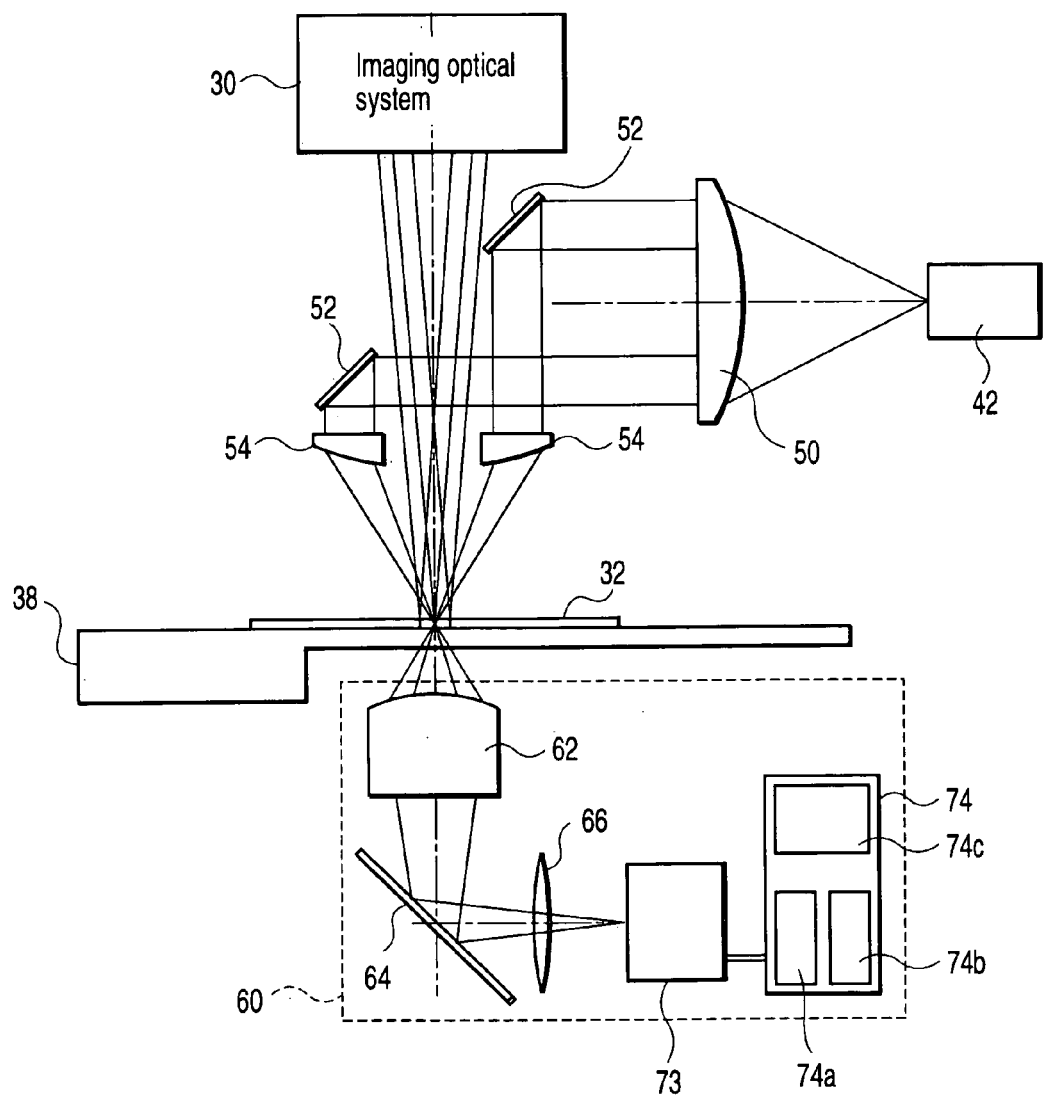
FIG. 11 is a diagram illustrating the configuration of a variation of the microscopic observing optical system according to the first embodiment.

In a variation of the microscopic observing optical system or monitoring section 60, so called a gated CCD imaging device 73 can be used by omitting the streak tube 68, as shown in FIG. 11, the gated CCD imaging device 73 has a combined function with a image intensifier 70 and a CCD imaging device 72. The gated CCD imaging device 73 is placed so as to pick up a two-dimensional image formed by the imaging lens 66. The gated CCD imaging device 73 picks up an instantaneous image on the fluorescent surface by a CCD imaging device as a two-dimensional image data. The instantaneous image on the fluorescent surface is obtained by applying a high voltage to a photo-multiplier only at a predetermined certain instant to multiply an image received by a two-dimensional photoelectric converting section and varying with time, and to record the two-dimensional image at that instant on the fluorescent surface. Accordingly, compared to the use of the streak tube 68, continuous data on a particular area cannot be obtained. However, the high voltage applied to the photomultiplier can be controlled at a temporal resolution of several nanoseconds. It is therefore possible to obtain a two-dimensional image of a large area at a desired instant.

Figure 12:
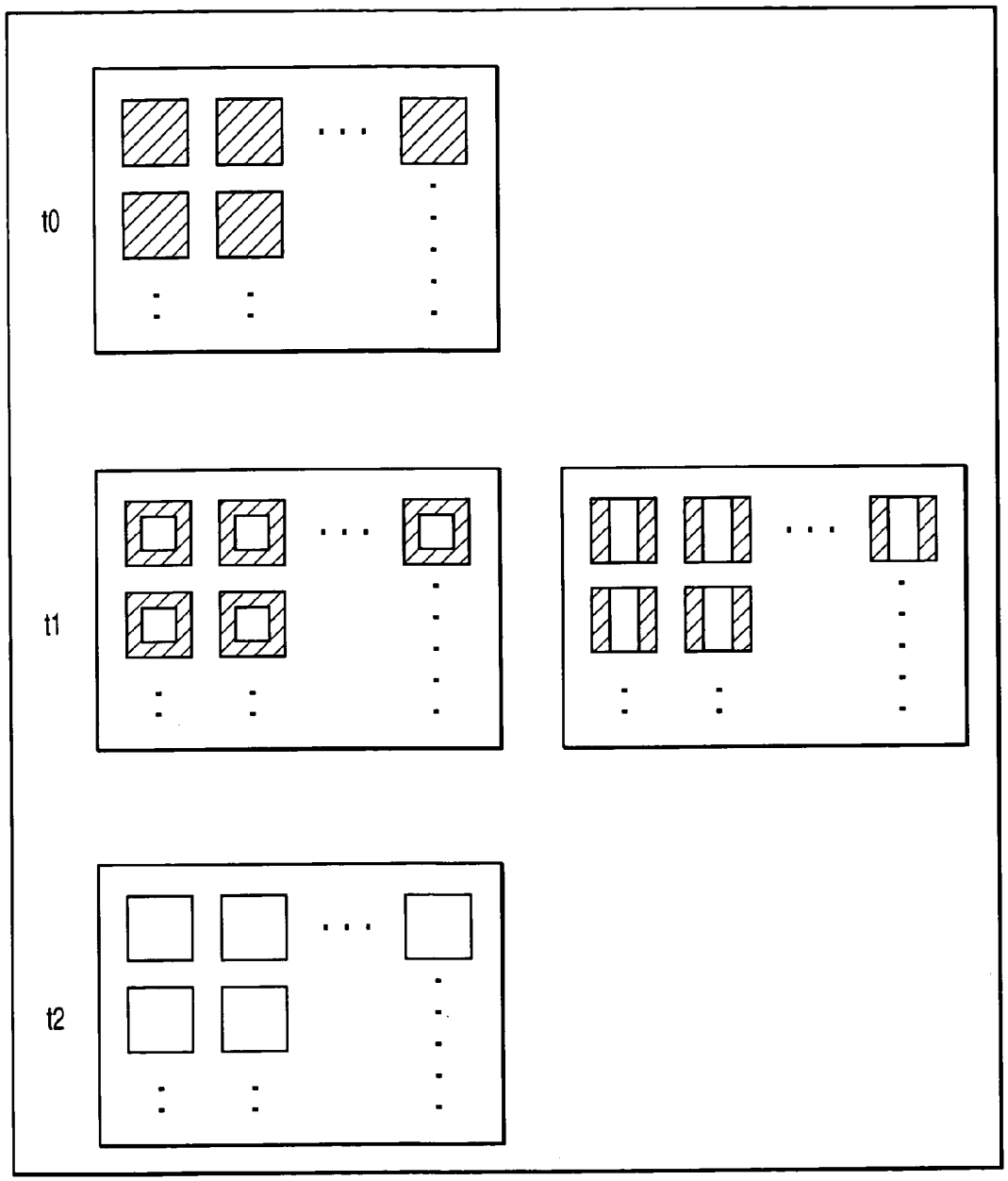
FIG. 12 is a view illustrating examples of two-dimensional image observed by the variation of the first embodiment shown in FIG. 11.

FIG. 12 shows an example of the resulting images according to the present variation. The upper figure shows a state ($t_0$) immediately after irradiation with an excimer laser light. The irradiated areas of the silicon thin film 35 are melted. A number of small melted areas are arranged in a matrix. Each melted area does not transmit an illumination light or monitor light and thus appears like a dark image. In the figure, the melted areas are hatched. The middle figures show a state a time t1 after the irradiation with the excimer laser light. The figures show that crystallization (white area) starts from the center of each melted area, while the outer part is remained in melt. The shape of the crystallized area can be controlled by design of patterns used in the phase shifter 28. The left one of the middle figures show an example in which a phase shifter that forms a squared light intensity distribution is used. In each melted area, a square area in the center is crystallized. The right one of the middle figures shows an example in which a phase shifter that forms a line-symmetrical light intensity distribution is used. Each crystallized area extends in the vertical direction of the figure, with the crystallization progressing in the horizontal direction in the figure. The lower figure shows a state a time $t_2$ after the irradiation with the excimer laser light. The crystallization has been finished, with the entire melted area appearing white. The boundary of the crystallized area can be recognized even after crystallization, since the melted then crystallized area has light reflection and transmission characteristics different from that of non-melted area.

In another variation, the streak tube 68 includes at least one of the acceleration electrode 68d and the photomultiplier 68e shown in FIG. 5. If a primary image outputted by the streak tube 68 has a sufficient intensity for the sensitivity of the CCD imaging device 72 or the CCD imaging device 72 has a sufficiently high sensitivity, the image intensifier 70 can be omitted.

The present embodiment is not limited to the previously described embodiments. The above embodiments may be further varied or partly omitted. For example, the mechanism that corrects the misalignment of the position of the substrate 32 of the laser crystallization apparatus 1 can be omitted. In this case, the laser crystallization apparatus is used to simply observe or monitor how the semiconductor thin film is melted and changes over time through crystallization without feeding back the results of observations to the laser crystallization process.

(Second Embodiment)

According to a second embodiment of the present invention, a crystallization apparatus comprises functions for melting a semiconductor thin film 35 formed on a substrate 32 by irradiating with an energy beam having an energy intensity distribution, and for observing or monitoring the semiconductor thin film 35 in a crystallization process. In the crystallization process, the melted semiconductor thin film 35 crystallizes laterally immediately after the energy beam irradiation. An observing illumination light or monitor light illuminates obliquely to the substrate 32. Then, reflected light from the substrate 32 in the crystallization process is observed or monitored.

Figure 13B:
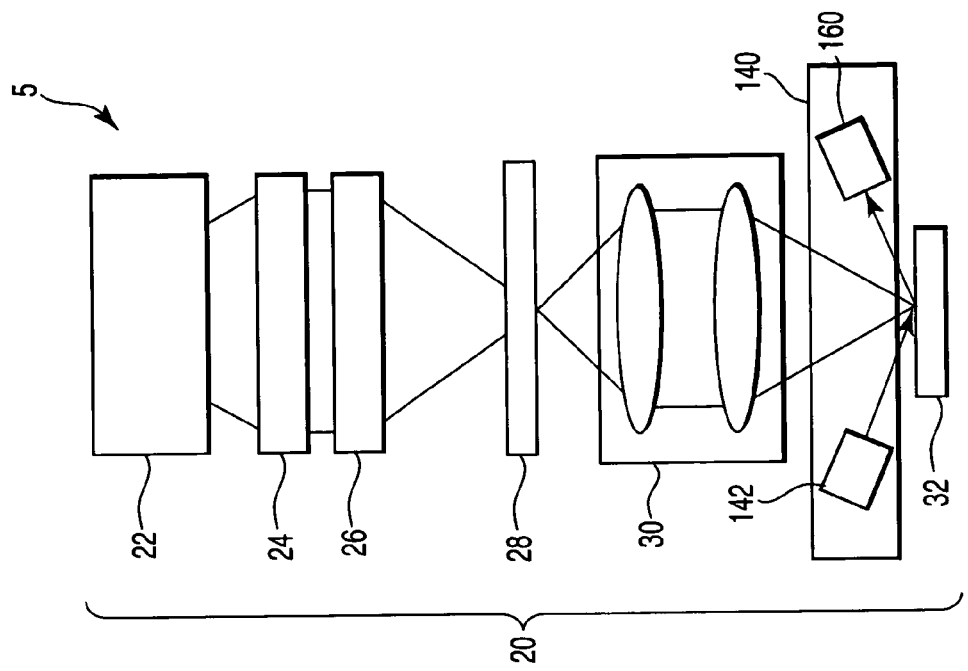
FIGS. 13A and 13B are exemplary diagrams of the configuration of a crystallization apparatus illustrating a second embodiment of the present invention.
Figure 13A:
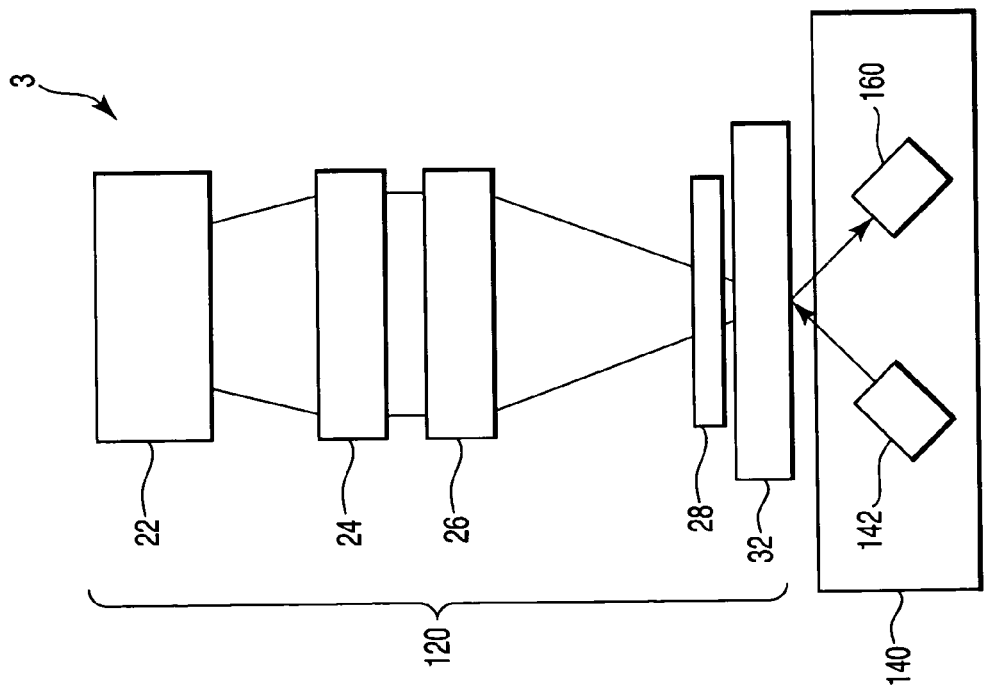

With reference to FIGS. 13A and 13B, a brief description will be given of a crystallization apparatus according to the second embodiment. A crystallization apparatus 3 in FIG. 13A is an example of an embodiment in which a rapid change in the crystallization process is observed or monitored from a back surface side opposite to a surface irradiated with a crystallizing energy beam. In the embodiment, the energy beam having an energy distribution is, for example, a phase modulated pulse excimer laser light.

A crystallization apparatus 5 in FIG. 13B is an example of an embodiment in which a rapid change in crystallization process is observed or monitored from a front surface side that is the surface irradiated with the crystallizing energy beam.

The laser crystallization apparatus 3, which monitors crystallization from the back surface side, is composed of a crystallizing optical system 120 and a microscopic observing system or monitoring device 140 provided below the back surface of the substrate 32 to monitor crystallization process, as shown in FIG. 13A. In the crystallizing optical system 120 according to the present embodiment, an imaging optical system 30 is removed from the crystallizing optical system 20 in the first embodiment, shown in FIG. 1. Further, the phase shifter 28 is placed in proximity to the substrate 32 to form a predetermined light intensity distribution to the crystallizing laser light. The crystallizing optical system 120 uses a beam expander 24 and a homogenizer 26 to make a pulse laser light uniform from an energy beam source, for example, the laser light source 22. The laser light is modulated by a phase shifter 28 to make a predetermined light intensity distribution, for example, an inverse peak-like pattern, then projected on the front surface of the substrate 32. In the illustrated example, the crystallizing optical system 120 does not use the imaging optical system 30. However, naturally enough, it is possible to use the crystallizing optical system 20 using the imaging optical system 30 such as the one shown in FIG. 1.

On the other hand, the laser crystallization apparatus 5, which monitors crystallization from the front surface side, is configured with a crystallizing optical system 20 and a microscopic observing system or monitoring device 140 that monitors crystallization from the front surface side, as shown in FIG. 13B. The crystallizing optical system 20 according to the present embodiment may be the same as the crystallizing optical system 20 according to the first embodiment, as shown in FIG. 1. The beam expander 24 and the homogenizer 26 make a pulse laser light uniform from an energy beam source, for example, the laser light source 22. The phase shifter 28 is provided at an imaging position of the beam expander 24 and the homogenizer 26. The substrate 32 is provided at an imaging position of the imaging optical system 30 against the phase shifter 28 and is irradiated with the laser light having the predetermined light intensity distribution. The reflection type microscopic observing system or monitoring device 140 is provided between the imaging optical system 30 and the substrate 32. The microscopic observing system 140 illuminates the substrate 32 obliquely with an illumination light or monitor light then observes or monitors an obliquely reflected illumination light or monitor light. It is thus possible to monitor crystallization, which begins immediately after the crystallizing laser light irradiation and moves laterally, from the front surface side irradiated with a crystallizing pulse laser light.

The substrate 32, on which the semiconductor thin film 35 is formed, is removably mounted on the substrate holding stage 38, which is three-dimensionally movable in the X-Y-Z direction. The substrate 32 is the same as the one in the first embodiment. The substrate 32 comprises the support substrate 33, on which the semiconductor thin film 35 is formed via the underlying insulating film 34. The semiconductor thin film 35 is covered with the cap insulating layer 36. In the present embodiment, the semiconductor thin film 35 is an amorphous silicon thin film. The amorphous silicon thin film is normally hydrogenated. The support substrate may be a transparent glass or plastic substrate, a silicon substrate, or the like. In this case, a transparent glass substrate is used.

The same microscopic observing system or monitoring device 140 may be used in both FIGS. 13A and 13B by being turned upside down. The microscopic observing system 140 comprises an observing illumination optical system or monitor light illuminating optical system 142 and a microscopic observing optical system or monitoring section 160 that receives a reflected light from the semiconductor thin film 35 irradiated with an observing illumination light or monitor light to monitor crystallization process. The crystallization process includes a lateral crystal grain growth or a lateral movement of a solid-liquid interface beginning immediately after the laser light irradiation and then moving laterally.

In the microscopic observing system or monitoring device 140 according to the present embodiment, the crystallization process area, changing at a very high speed, is suitably observed or monitored using the streak camera 68 as in the case of the first embodiment. As previously described, light in a single measurement, the streak camera 68 can acquire a temporal variation in the intensity of measuring light from the substrate 32 from a reference time, for example, a time of irradiation with a crystallizing excimer laser.

The observation or monitoring of crystallization processes outputting an imaging information in which an image of the crystallization process area is expanded or compressed in either one direction, for example, a horizontal or vertical direction, in which crystal grains grow. Optical or electric means can be used to expand or compress the image of the crystallization process area in either the horizontal or vertical direction. The optical means is, for example, the disposition of a cylindrical lens 166 in the microscopic observing optical system or monitoring section 160. The electric means is, for example, the connection of an expansion or compression circuit to an output circuit of the streak camera 68. The means for expanding or compressing the image of the crystallization process area in either the horizontal or vertical direction is possible to vary a magnification ratio between the horizontal (X) direction and the vertical (Y) direction in order to form a faint light from, for example, a micrometer-order area into an image in the streak camera at a favorable S/N ratio. That is, for example, the horizontal information of the imaging information is magnified, while the vertical information is contracted. As a result, it is possible to pick up an image of a crystallization process area on the order of microns for a time on the order of nanoseconds.

Figure 14:
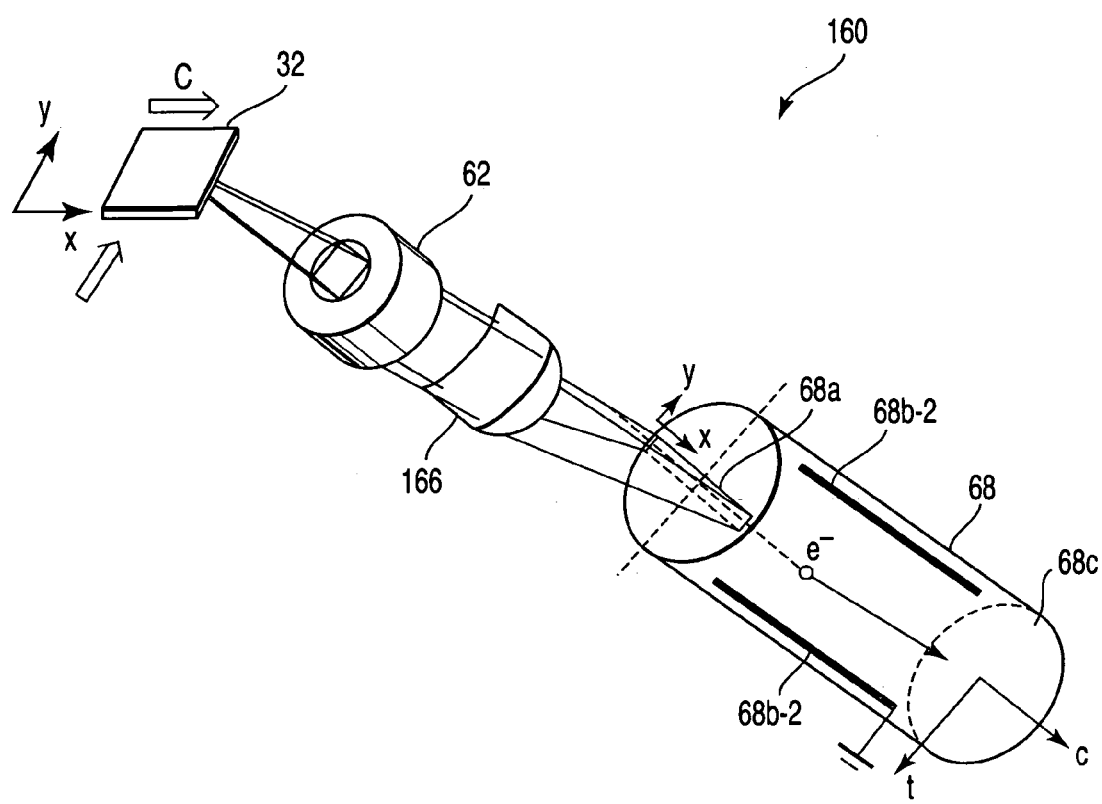
FIG. 14 is a perspective view illustrating an example of a method of observing or monitoring temporal changes in a melted area of a semiconductor thin film created by irradiation with a crystallizing laser light according to the second embodiment.

With reference to FIG. 14, description will be given of a method for observing or monitoring temporal changes in the melted area in the silicon thin film 35 created by irradiation with a crystallizing laser light according to the present embodiment. Irradiation with a laser light melts the irradiated area in the silicon thin film 35. During a cooling and solidifying process after the melting, the thin film 35 is crystallized. To allow crystals to grow preferentially in a desired direction, the phase shifter 28 is used to provide a temperature distribution in melting the silicon thin film 35. In the example shown in FIG. 14, an arrow C shows the direction in which the crystal growth progresses preferentially. During or immediately after the irradiation with the laser light, the semiconductor thin film 35 is irradiated with an illumination or monitor light.

The illumination or monitor light is partly reflected by the semiconductor thin film 35. The reflected light is received, through a microscopic objective lens 62 and the cylindrical lens 166, by a photoelectric converting device utilizing a photoelectric effect, for example, a photoelectric surface 68a of the photo detector 68, that is, the light receiving surface 68a which is a light sensing surface. The photo detector or reflected light measuring instrument 68 is the same as the one described in FIG. 5.

In the illustrated example, the cylindrical lens 166 has a sectional shape (perpendicular to a generatrix) formed of two curves with different curvatures. In this example, light beams passed through the cylindrical lens 166 are condensed to an inside direction of the curvature of the cross section of the cylindrical lens 166. However, in the generatrix direction, the light beams remain unchanged with no conversion or divergence occurring. Alternatively, the sectional shape of the cylindrical lens 166 may be such that light beams passed through the cylindrical lens 166 are diverged in the cross sectional direction of the cylindrical lens 166. In this manner, the cylindrical lens 166 having an appropriately selected sectional shape enables light beams passed through the cylindrical lens 166 to project the entire photoelectric surface 68a. Alternatively, light beams passed through the cylindrical lens 166 can be allowed to project the entire photoelectric surface 68a by changing the position of the cylindrical lens 166.

In a measurement of the crystal growth in the silicon thin film 35, an accuracy of the measurement can be improved by allowing a reflected light to enter the cylindrical lens 166 so as to align the direction of the crystal grain growth in the silicon thin film 35 with the direction of the generatrix of the cylindrical lens 166. In the illustrated example, the photoelectric surface 68a has an elongated rectangular planar shape. A reflected light projected on the photoelectric surface 68a is converted into photo-electrons as described with reference to FIG. 5. The photoelectrons are reaches to the fluorescent surface 68c by changing their traveling direction depending on the voltage between the sweep electrodes 68b-2. A two-dimensional image is recorded on the fluorescent surface 68c, the image representing temporally changing information in the crystallization along a crystal growth direction C. Specifically, a temporal change in the distribution of intensities of reflected light projected on the photoelectric surface 68a along the crystal growth direction is measured. Temporal changes in the melted area in the silicon thin film 35 can be determined from the above results.

In the example shown in FIG. 14, the reflected light from the semiconductor thin film 35 has an almost square in sectional shape. The reflected light passed through the cylindrical lens 166 has an almost rectangular in sectional shape on the photoelectric surface 68a. The ratio of the length Lx in the X direction on the semiconductor thin film 35 to its length Ly in the Y direction is converted into, for example, the ratio of the length LX in the X direction on the photoelectric surface 68a to its length LY in the Y direction.

In the illustrated example, upon passing through the cylindrical lens 166, the reflected light is relatively condensed in a direction orthogonal to imaginary lines extending along the direction of the crystal growth (arrow C) in the silicon thin film 35. This increases in the quantity of light projected on the photoelectric surface 68a to improve the S/N ratio for measurements. The crystal growth rate can thus be measured accurately.

Description will be given below of a method of further improving the S/N ratio. In the measurement of the lateral growth of the silicon thin film 35 utilizing a light reflected by the thin film 35, it is assumed that a reflectance of the silicon thin film 35 for the observing illumination or monitor light is 10%, a spatial resolution is 0.33 µm (to provide a sufficient margin for the measuring accuracy, it is set equal to one-third of a required spatial resolution of 1 µm and corresponds to a measuring accuracy for about 10 electrons), and a temporal resolution is 1 nsec. Then, if an ideal photo detector or reflected light measuring instrument 68 is used which may undergo only statistical errors, an equation is established which enables measurements to be made with a fluctuation of 6%. However, this equation does not take into account a dark noise (dark current) generated by the reflected light measuring instrument 68 itself. In the actual measurement of the reflected light, the magnitude of fluctuations may be increased.

Figure 15:
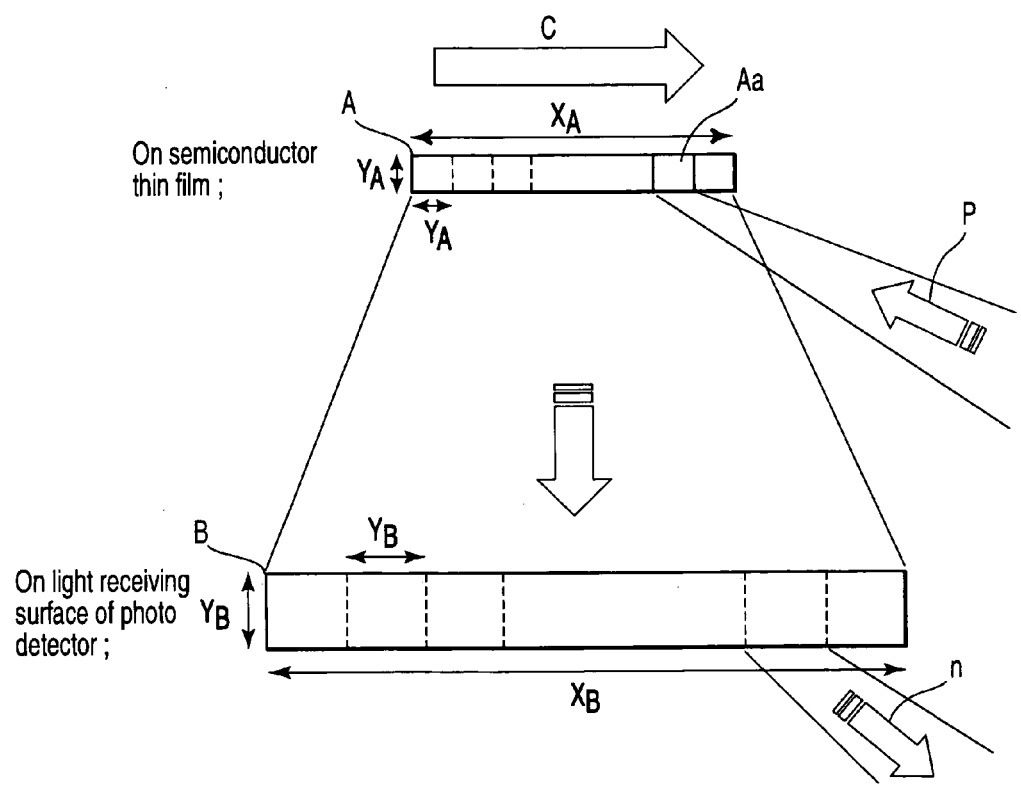
FIG. 15 is a view illustrating a method of observing or monitoring temporal changes in the melted area in the semiconductor thin film shown in FIG. 14.

Referring to FIG. 15, description will be given of an example in which an observing illumination light or monitor light illuminates an almost rectangular area A of $X_A$ [µm]× $Y_A$ [µm] on the silicon thin film 35, for example, the almost rectangular area A of about 10 µm×about 1 µm. The direction of crystal growth is shown by an arrow C. In some cases, $X_A$ [µm] may be about 50 µm.

The observing illumination or monitor light may be, for example, a visible laser light. The irradiation power P of the monitor light is, for example, 1 mW/µm² for a very small part Aa in the area A which has an area a (for example, an almost square part of about 1 µm×about 1 µm) The irradiation power of 1 mW/µm² corresponds to irradiation with $(10^{-3}/4e^{-19})$ photons/µm². For example, the irradiation power is obtained by irradiating (2.5e×15 photons)/µm² of laser light having a wavelength of about 532 nm, that is, irradiating (2.5e×6 photons)/µm² per nsec of laser light having a wavelength of about 532 nm.

The microscopic objective lens 62 magnifies, for example, 300 times, a reflected light that is an observing illumination or monitor light reflected by the silicon thin film 35. Then, the cylindrical lens 166 allows the reflected light to enter a photoelectric surface 68a of a photo detector 68. On the photo-electric surface 68a, the cross section of the reflected light is formed into an almost rectangular area B of $X_B$ [mm]×$Y_B$ [µm], that is, the almost rectangular area B of about 3 mm×about 300 µm.

Description will be given of the number of electrons obtained by photoelectrical conversion of the incident reflected light on the photoelectric surface 68a. In this case, it is assumed that a reflectance the silicon thin film 35 for the observing illumination or monitor light is 100%, the transmittance of the lenses in the optical system is 10%, and a quantum efficiency (hereinafter referred to as "QE") of the photoelectric surface 68a is 10%. The number n of electrons generated by the photoelectric surface 68a is (2.5e×4 photons)/µm² per nsec for the observing illumination or monitor light having the previously described irradiation power.

The value of a statistical fluctuation in 1 nsec in the quantity of light reflected by a reflection surface having a reflectance of 100% is $((2.5e^4)^{1/2}/(2.5e^4))\times 100 = 0.6\%$. The value of a statistical fluctuation in 1 nsec in the quantity of light reflected by a reflection surface having a reflectance of 10% is $((2.5e^3)^{1/2}/(2.5e^3))\times 100 = 0.07\%$ if the spatial resolution is 0.33 µm.

The S/N ratio for measurements can be improved by increasing the irradiation power of an observing illumination or monitor light. However, the irradiation power has an upper limit in order to prevent the quality degradation of the amorphous silicon thin film or polycrystal silicon thin film, that is, the film quality, by the irradiation with the monitor light. The value of the upper limit depends on the quality of the silicon thin film, the film thickness, and the pattern of the film. For example, for a silicon thin film having a uniform film thickness of 100 nm and without having the previously described pattern, the upper limit of the irradiation power is 1 mW per unit irradiated area of diameter 1 µm if a laser light having a wavelength of about 532 nm is used.

Figure 16:
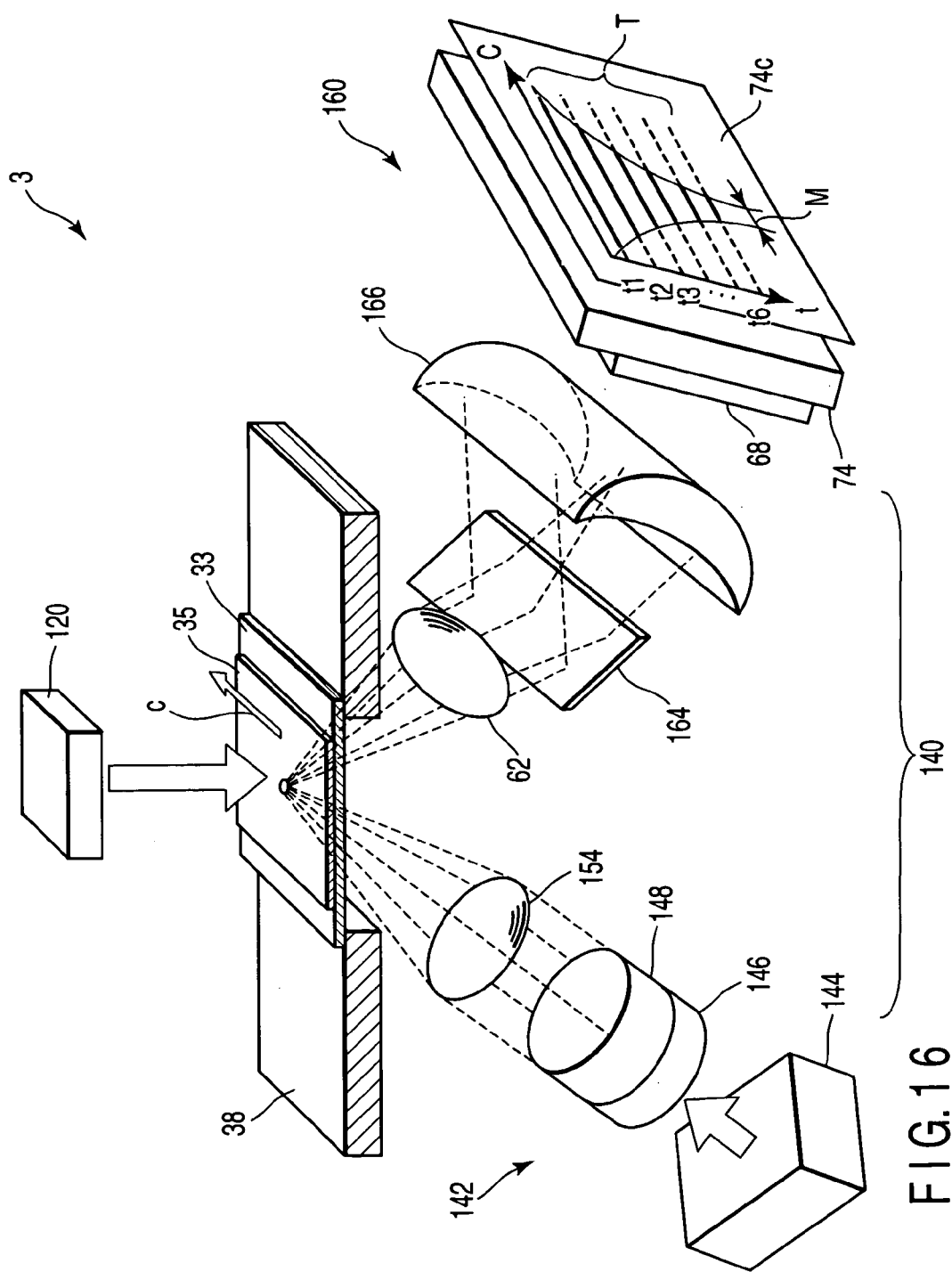
FIG. 16 is a perspective view illustrating an example of a monitoring apparatus that observes or monitors temporal changes in the melted area in the semiconductor thin film created by irradiation with a crystallizing laser light according to the second embodiment.

With reference to FIG. 16, description will be given of an embodiment of an apparatus that measures temporal changes in the melted area in the semi-conductor thin film 35 created by irradiation with a crystallizing laser light according to the present embodiment. In the example shown in FIG. 16, a microscopic observing system or monitoring device is denoted by reference numeral 140. A laser crystallization apparatus including the microscopic observing system or monitoring device is generally denoted by reference numeral 3.

The laser crystallization apparatus 3 comprises a crystallizing optical system 120, an X-Y stage driving mechanism (not shown) that two-dimensionally moves a substrate holding stage 38, on which a substrate 32 with a semiconductor thin film 35 formed on it is mounted, and a microscopic observing system or monitoring device 140.

The crystallizing optical system 120 may be composed of a part of the crystallizing optical system 20 in the first embodiment. Accordingly, its detailed description is omitted. An irradiation of crystallizing laser light to the semiconductor thin film 35 may be performed to a particular part, for example, a band-like area of 365 mm×400 µm or a square area of about 12 mm×12 mm.

The microscopic observing system or monitoring device 140 includes an observing illumination optical system or monitor light illuminating optical system 142 and a microscopic observing optical system or monitoring section 160. The observing illumination optical system or monitor light illuminating optical system 142 comprises an observing illumination light source or monitor light source 144, a shaping optical device 146, a homogenizer 148, and a condenser or imaging lens 154. The microscopic observing optical system or monitoring section 160 includes a cylindrical lens 166, a photo detector or reflected light measuring instrument 68, and an image processing unit or calculating device 74. The microscopic observing optical system 160 may further comprise a microscopic objective lens 62 and a reflector 164.

An illumination or monitor light from the observing illumination light source or monitor light source 144 is applied so as to be condensed in an area on the semiconductor thin film 35 which has been irradiated with a crystallizing laser light. The observing illumination light source 144 comprises, for example, one of an Ar laser, an He—Ne laser, or an Nd:YAG laser. The illustrated observing illumination light source 144 is a continuous wave laser (hereinafter referred to as a "CW laser") light source device that generates an S- or P-polarized laser light. In the illustrated example, a light source for Nd:YAG laser having a wavelength of about 532 nm is used to generate a laser light having a power of 1 mW/µm².

The observing illumination light source or monitor light source 144 is connected to a timing control section or time adjusting device 10 (not shown), connected to the crystallizing laser light source 22. The timing control section 10 is provided with a selectively preset time to start generating an illumination or monitor light with respect to a time to start generating a crystallizing laser light. In accordance with this setting, the timing control section 10 sends the observing illumination light source 144 a signal instructing the start of emission of the monitor light. In the illustrated example, simultaneously with the start of emission of the crystallizing laser light, the timing control section 10 sends the observing illumination light source 144 the signal instructing the start of emission of the monitor light.

The shaping optical device 146 defines a shape of a cross section of the laser light emitted by the observing illumination light source or monitor light source 144 into a predetermined form. In the illustrated example, the shaping optical device 146 shapes the cross section of the laser light emitted by the observing illumination light source 144 into a circular form.

The homogenizer 148 adjusts the laser light through the shaping optical device 146 so that the laser light has a uniform light intensity distribution in its cross section. For example, the light intensity distribution in the cross section of an Nd:YAG laser from the light source conforms to a Gaussian distribution and is not uniform. Upon passing through the homogenizer 148, the Nd:YAG laser light is adjusted so as to have a uniform light intensity distribution in its cross section.

The condenser or imaging lens 154 converges the illumination or monitor light on the semiconductor thin film 35, the light passes through the shaping optical device 146 and homogenizer 148 and has a circular cross section with a uniform light intensity distribution. In the illustrated example, the monitor light illuminates the amorphous silicon semiconductor thin film 35 so as to be condensed on it through a glass support substrate 33 from the backside of the substrate 32.

The amorphous silicon semiconductor thin film 35 reflects at least part of the illumination or monitor light applied to the amorphous silicon semiconductor thin film 35. The reflected light passes through the support substrate 33 again and then reflected by the reflector 164 to change its traveling direction. Then the light passes through the cylindrical lens 166 and is projected on the photo detector or reflected light measuring instrument 68. Since the silicon thin film becomes metallic upon being melted, it reflects 90% or more of the monitor light. However, in an area of unmelted or solidified after crystallization, the silicon thin film has a low reflectivity, since the silicon thin film transmits most of visible light, particularly red one. It is therefore possible to distinguish a melted area from a crystallized area by measuring the distribution of reflected light intensities.

In the illustrated example, the cylindrical lens 166 is placed so that its generatrix is parallel to the semiconductor thin film 35 and to the direction (C) of crystal growth in the semiconductor thin film 35. The traveling direction of the reflected light can be properly changed by adjusting the orientation of the reflector 64. Upon passing through the cylindrical lens 166, the reflected light is condensed in a direction orthogonal to imaginary lines extending along the direction(C) of the crystal growth in the semiconductor thin film 35.

The photo detector or reflected light measuring instrument 68 receives a reflected light on its photoelectric surface 68a. The reflected light is an observing illumination or monitor light reflected by the silicon thin film 35. As shown in FIG. 16, the photo detector or reflected light measuring instrument 68 is, for example, a device using a streak camera that converts a light into electrons and then converts the electrons into a light again. The band-like planar photoelectric surface 68a converts the received reflected light into a number of photoelectrons corresponding to the intensity. The photoelectrons pass a sweep electrode 68b-2, to which a temporally changing electric field is applied, are then converted into time changing information, and then reaches on a fluorescent surface 68c. Then, a projected image corresponding to the photoelectron intensity, that is, the number of electrons, is formed on the fluorescent surface 68c is measured as a temporal change in the intensity distribution.

The projected image displayed on the fluorescent surface 68c can be treated as two-dimensional information. Accordingly, by using imaging means, for example, a CCD imaging device to pick up the projected image into digital information, the digital information can be loaded into the image processing unit 74 and then stored in a storage section 74b. The digital information can also be processed by the control circuit 74a, for example, a computer. Alternatively, the digital information may be properly displayed on a display section 74c.

The image processing unit 74 extracts a plurality of band-like image data at desired times t1, t2, t3, . . . corresponding to the temporal resolution from the continuous two-dimensional projected image displayed on the fluorescent surface 68c. Subsequently, a projected image for each time measured in an analog manner is subjected to image processing to determine a intensity distribution at that time. Thereafter, a time series processing is executed to calculate a temporal change in the intensity distribution of the reflected light. On the basis of the result of the calculation, temporal changes in the melted area in the semiconductor thin film 35 are monitored and displayed on the display section 74c of the image processing unit 74.

An image on the display 74c in FIG. 16 is an example of measurement result displayed by the image processing unit or calculating device 74. For the entire measurement period T, the image showing the light intensity distribution of the projected images indicates the relationship between the measurement time tn and the position irradiated with an illumination or monitor light in the longitudinal direction, that is, the position in the crystal growth direction C in the semiconductor thin film 35. In the figure, for understanding, the entire measurement period T is 60 nsec, and the intensity of the reflected light is sampled at 10 nsec increments, that is, at times t1, t2, t3, . . . , t6. The entire measurement period T and the times t1, t2, . . . are not limited to these. In the above image, solid lines indicate that the silicon thin film 35 is melted having an increased reflected light intensity, while dotted lines indicate that the silicon thin film 35 is in a solid having a reduced reflected light intensity. Specifically, the solid lines indicate that the silicon thin film is melted and is in a liquid phase. The length M of each solid line indicates the width of the melted area in the silicon thin film 35 at each time t1, t2, t3, . . . , t6. The display section 74c two-dimensionally indicates a temporal change in the melted width M.

(Variation of Second Embodiment)

Figure 17:
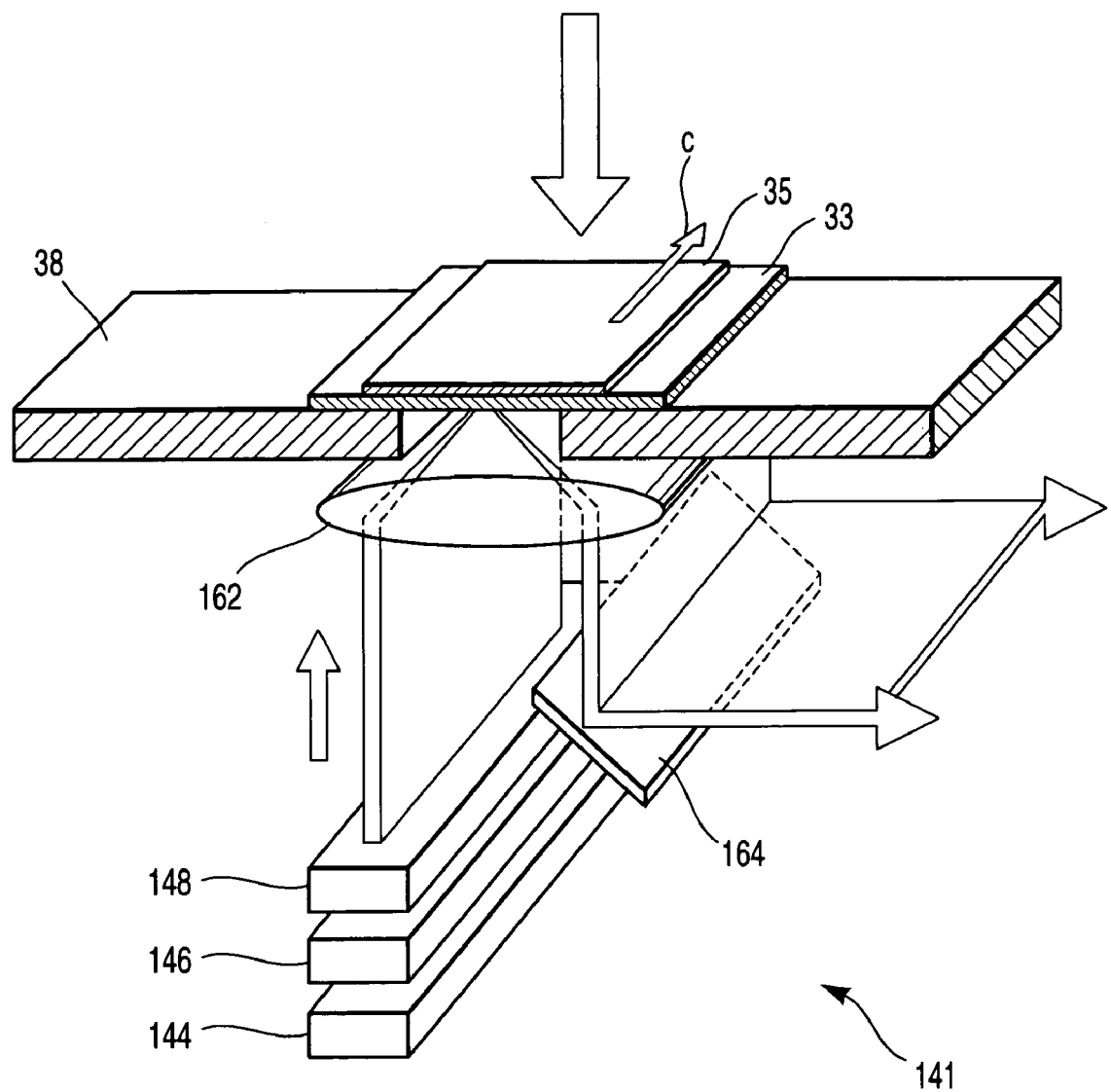
FIG. 17 is a perspective view illustrating another example of the monitoring apparatus that observes or monitors temporal changes in the melted area in the semiconductor thin film created by irradiation with the crystallizing laser light according to the second embodiment.
Figure 18A:
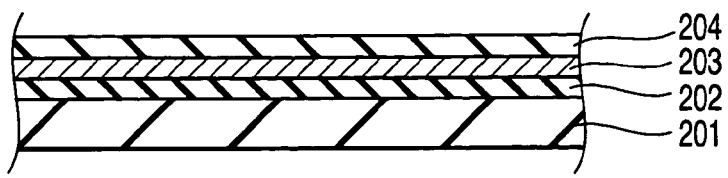
FIGS. 18A to 18F are sectional views illustrating steps of manufacturing a semiconductor thin film transistor according to the present invention.
Figure 18B:
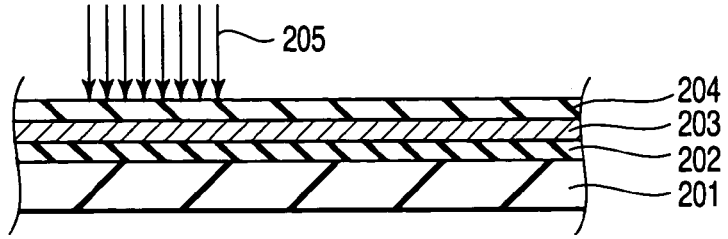
Figure 18C:
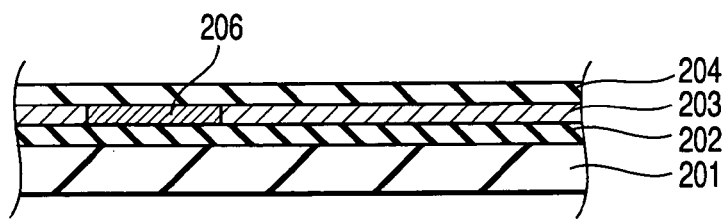
Figure 18D:
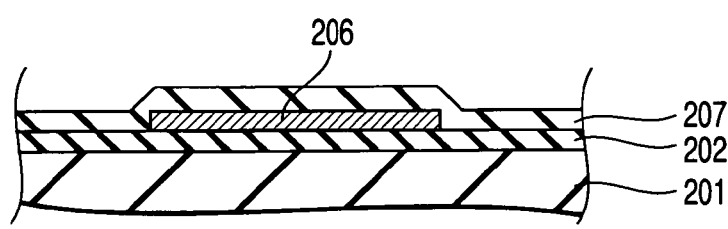
Figure 18E:
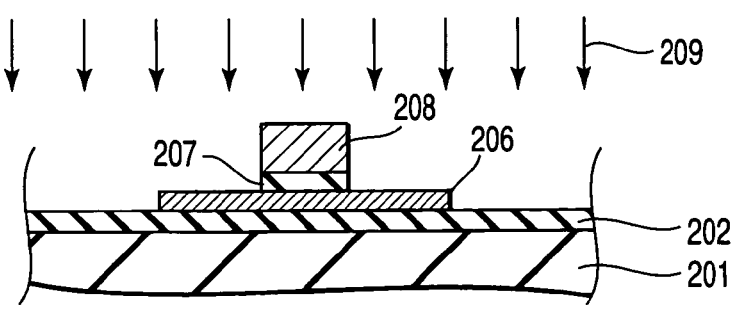
Figure 18F:
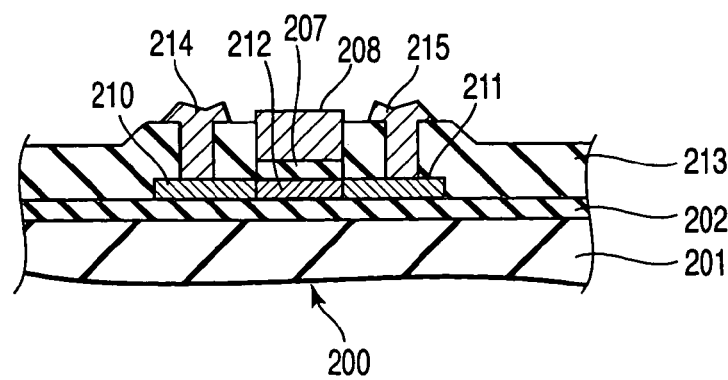

With reference to FIG. 17, description will be given of another embodiment of a microscopic observing system or monitoring device for observing temporal changes in the melted area in the semiconductor thin film 35 created by irradiation with a crystallizing laser light. In the example shown in FIG. 17, a microscopic observing system or monitoring device according to the present invention is generally denoted by reference numeral 141. The cylindrical lens 166, the photo detector or reflected light measuring instrument 68, and the image processing unit or calculating device 74 are similar to those in the example shown in FIG. 16. They are thus omitted.

An observing illumination optical system 143 of the microscopic observing system or monitoring device 141 comprises an observing illumination light source or monitor light source 144, a shaping optical device 146, a homogenizer 148, and a microscopic objective lens 162. The microscopic observing optical system 161 comprises the microscopic objective lens 162, also used in the observing illumination optical system 143, a reflector 164, a cylindrical lens 166 (not shown), a photo detector or reflected light measuring instrument 68 (not shown), and an image processing unit or calculating device 74 (not shown).

As the observing illumination light source or monitor light source 144, a laser source generating a laser light described above can be used. As the same as the previous description, the monitor light source 144 is connected to the timing control section 10 (not shown) which is connected to the crystallizing laser light source 22. In the illustrated example, the timing control section 10 sends the observing illumination light source 144 a signal instructing the start of emission of an illumination or monitor light simultaneously with the start of emission of a crystallizing laser light.

In the present embodiment, the shaping optical device 146 shapes a laser light emitted by the observing illumination light source or monitor light source 144 so that the light has a rectangular cross section having shorter sides and longer sides much longer than this shorter sides. The homogenizer 148 converts the laser light passed through the shaping optical device 146 into one having a uniform light intensity distribution in its cross section.

The microscopic objective lens 162 for imaging forms an image of a light on the semiconductor thin film 35, where the light is the plate-like illumination or monitor light having a uniform light intensity distribution passed through the shaping optical device 146 and the homogenizer 148. The cross section of the plate-like illumination light is rectangular with a particular ratio of a shorter side to a longer side. In the illustrated example, the monitor light illuminates the substrate 32 from the back side and is thus applied, through the glass support substrate 33, to the back surface of the semiconductor thin film 35 closer to the glass support plate 33. The monitor light is thus formed into an image having a cross section of, for example, 60×1 µm, on the back surface of the semiconductor thin film 35.

At least part of the illumination or monitor light applied to the semiconductor thin film 35 is reflected from the back surface of the semiconductor thin film 35 as a reflected light. The microscopic objective lens 162 also receives the reflected light from the semiconductor thin film 35. The reflector 164 is a movable mirror that can change the orientation of its reflecting surface. The reflector 164 receives the reflected light passed through the microscopic objective lens 162 on its reflecting surface, then changes the traveling direction of the light so that the light travels to the photo detector or reflected light measuring instrument 68 (not shown). The reflected light having its traveling direction changed passes through the cylindrical lens 166 (not shown) and reaches the photo detector 68.

(Embodiment of Thin Film Semiconductor Device)

Now, with reference to FIGS. 18A to 18F, description will be given of an embodiment in which a thin film semiconductor device (TFT) is formed in a crystallized semiconductor layer. A non single crystal semiconductor thin film 203 composed of, for example, amorphous or polycrystal silicon 203, is formed on a support substrate 201 (for example, a transparent rectangular substrate formed of alkali glass, quartz glass, plastic, polyimide, or the like) via an underlying insulating film 202 by a film forming technique such as a chemical vapor deposition process or a sputtering process. A cap insulating film 204 is formed on the amorphous silicon thin film 203 (see FIG. 18A).

The underlying insulating film 202 may be, for example, an SiN or $SiO_2$ film having a thickness of 50 to 100 nm, or a laminate of these films. The amorphous silicon thin film 203 has a thickness of, for example, about 50 to 200 nm. Other semiconductor thin film, such as Ge, or SiGe, can be used.

The amorphous silicon thin film 203 is processed by irradiating with an excimer laser light 205, for example, a KrF or XeCl excimer laser light as an energy beam (see FIG. 18B), while using the microscopic observing system or monitoring device to observe or monitor the crystallization process as described in the first and second embodiments. As a result, the amorphous silicon thin film 203 is crystallized or recrystallized in a controlled manner to form a crystallized silicon thin film 206, for example, having large single crystal grains (see FIG. 18C). Since the crystallized silicon thin film 206 is crystallized under a managed situation by observing or monitoring the crystallization, the silicon thin film 206 has a high crystallinity, i.e., all the crystallized areas have uniform and large single crystal grains.

The crystallized silicon thin film 206 to have large single crystal grains is processed into island-like crystallized silicon thin films 206 by photolithography or the like. The cap insulating film 204 is removed. Then, a gate insulating film 207 composed of a material such as silicon oxide ($SiO_2$) is formed on the substrate including the island-like crystallized silicon thin film 206 (see FIG. 18D). A gate electrode 208 is formed on the gate insulating film 207. Then, using the gate electrode as a mask, impurity ions 209, such as phosphorous or boron, are selectively implanted into the island-like semiconductor thin film 206 (see FIG. 18E). As a result, a source 210 and a drain 211 into which the impurities are doped are formed, and a channel 212 is formed between the source 210 and the drain 211. Then, an $SiO_2$ film is formed entire surface of the substrate as an interlevel insulator 213. Contact holes are then formed in the interlevel insulator 213 on the source 210 and drain 211, respectively. A source electrode 214 and a drain electrode 215 are then formed on the interlevel insulator 213 so as to be electrically connected to the source 210 and the drain 211, respectively, via the contact holes (see FIG. 18E). In this way, a top gate type TFT 200 is completed.

(Embodiment of Display Apparatus)

Figure 19:
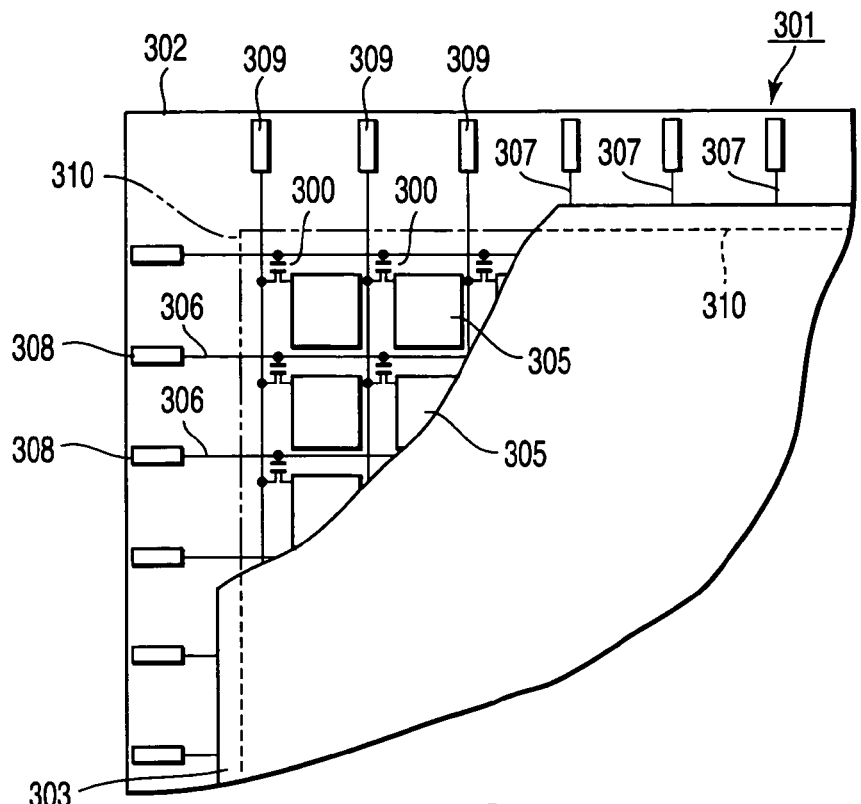
FIG. 19 is a plan view illustrating an embodiment of a display apparatus according to the present invention.
Figure 20:
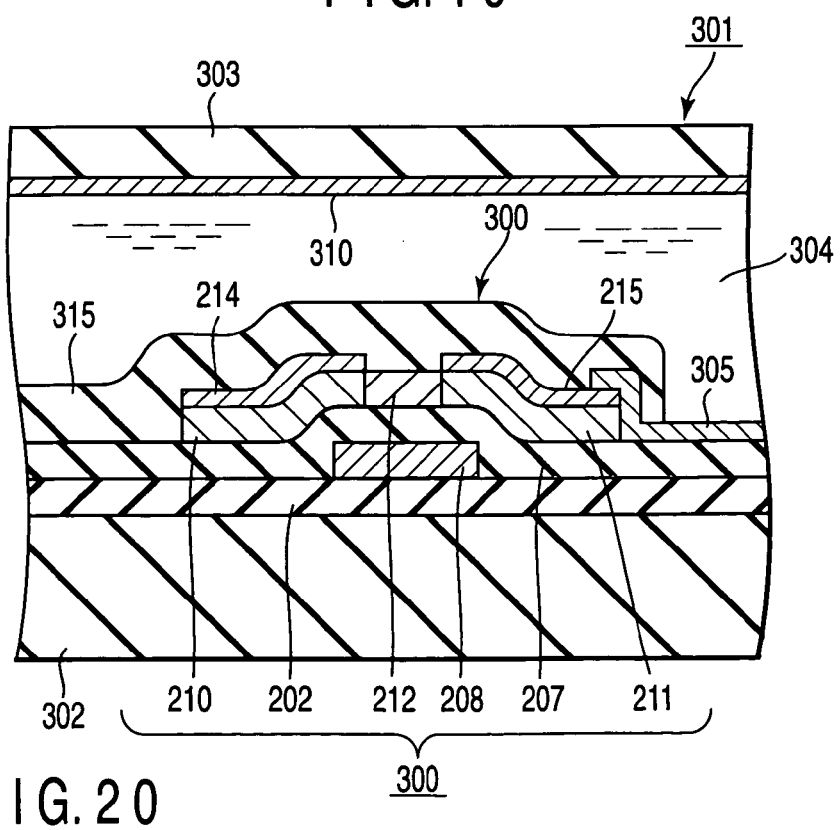
FIG. 20 is a sectional view of a liquid crystal display apparatus including a thin film transistor section, illustrating an embodiment according to the present invention.

Now, with reference to FIGS. 19 and 20, description will be given of an embodiment of a liquid crystal display apparatus 301 in which a display apparatus comprising the TFT described above is applied. In these figures, the same components as those in FIG. 18 are denoted by the same reference numerals. Their detailed description is omitted to avoid duplication. In FIGS. 19 and 20, a display apparatus, for example, an active matrix type liquid crystal display apparatus is shown. In FIGS. 19 and 20, an auxiliary capacity is omitted. In the figures, reference numeral 300 denotes a TFT. The TFT 300 in this embodiment is an example of a bottom gate type TFT having the gate electrode 208 formed below a semiconductor layer in which the source 210 and the drain 211 are formed. The TFT is not limited to the bottom gate type TFT 300. The top gate type TFT 200 described above may also be used.

As shown in FIGS. 19 and 20, the liquid crystal display apparatus 301 comprises a pair of a front and rear transparent substrates 302 and 303, a liquid crystal layer 304, pixel electrodes 305, thin film transistors (TFT) 300, scanning wirings 306, signal wirings 307, scanning wiring terminals 308 operating as connection terminals, signal wiring terminals 309 operating as connection terminals, a opposing electrode 310, and the like.

The pair of transparent substrates 302 and 303 may be, for example, a pair of glass substrates. The transparent substrates 302 and 303 will be referred to as glass substrates. The glass substrates 302 and 303 are joined together via a frame-like seal member (not shown). The liquid crystal layer 304 is provided in a space between the glass substrates 302 and 303 and enclosed by the seal member.

As shown in FIG. 20, one of the pair of the glass substrates 302 and 303, for example, the rear glass substrate (array substrate) 302 is provided, on its inner surface, with the plurality of transparent pixel electrodes 305 formed in a matrix extending in a row direction and a column direction, the plurality of TFTs 300 connected to the respective pixel electrodes 305, the scanning wirings 306 and signal wirings 307 each electrically connected to the plurality of TFTs 300, and the plurality of scanning wiring terminals 308 and plurality of signal wiring terminals 309 formed at respective edges of the substrate 302.

The scanning wirings 306 are provided along the respective rows of the pixel electrodes 305. One end of each scanning wiring 306 is connected to the corresponding one of the plurality of scanning wiring terminals 308, provided at the edge of the rear substrate 302. The plurality of scanning wiring terminals 308 is connected to a scanning circuit (not shown).

On the other hand, the signal wirings 307 are provided along the respective columns of the pixel electrodes 305. One end of each signal wiring 307 is connected to the corresponding one of the plurality of signal wiring terminals 309, provided at the edge of the rear substrate 302. The plurality of signal wiring terminals 309 is connected to a sample hold circuit (not shown).

On inside surface of the other glass substrate, i.e., the front glass substrate (opposing substrate) 303, the transparent opposing electrode 310, which is a single film like and oppose to the plurality of pixel electrodes 305, is provided. Further, the front glass substrate 303 may be provided, on its inner surface, with color filters corresponding to a plurality of pixel sections in which the respective pixel electrodes 305 opposes the opposing electrode 310, and shielding films corresponding to the areas between the pixel sections.

A polarizing plate (not shown) is provided outside of the pair of glass substrates 302 and 303. In the transmission type liquid crystal display apparatus 301, a planar light source (not shown) is provided behind the rear glass substrate 302. The liquid crystal display apparatus can be of a reflection type or a semi-transmission-reflection type.

In FIG. 20, the TFT 300 is of, for example, the bottom gate type. An interlevel insulator 315 is formed on a surface of the bottom gate type TFT 300. The TFT 300 is not limited to the bottom gate type but may be of, for example, the top gate type.

As described above, the present invention makes it possible to observe or monitor the crystallization process of the semiconductor thin film formed on the substrate at a high spatial resolution of at most several μm and a high temporal resolution on the order of nanoseconds, in real time or immediately after the pulse laser light irradiation. The crystallization process includes melting a semiconductor thin film by irradiating an energy beam having a predetermined energy distribution, for example, a pulse excimer laser with phase modulation to have the predetermined light intensity distribution, and crystallizing the melt to grow crystal grains laterally controlled by the energy distribution. For example, by controlling a crystallization process on the basis of the results of the observation or monitoring, the crystallization process is stabilized. It is thus possible to provide a crystallization apparatus and method that enables a high-quality semiconductor thin film to be efficiently crystallized, a thin film transistor using this semiconductor thin film, a method of manufacturing a thin film transistor, and a display apparatus using this thin film transistor.

The present invention is not limited to the previously described embodiments. The previously described embodiments include various levels. Thus, various inventions can be extracted by properly combining any of the disclosed plurality of constitution requirements together. For example, some of all the constitution requirements shown in the embodiments may be omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser crystallization apparatus comprising a crystallizing optical system which irradiates a thin film formed on a substrate with a pulse laser light having a predetermined light intensity distribution to melt the thin film and to crystallize the thin film growing grains laterally immediately after the pulse laser light irradiation, the apparatus comprising:
   an illumination light source provided out of an optical path of the laser light to emit an observing illumination light which illuminates the thin film;
   an illumination optical system including an annular optical element which provides the optical path of the laser light in a central portion and guides the illumination light from the illumination light source to the thin film along the optical path; and
   an observing optical system which magnifies the illumination light transmitted through the substrate including the thin film, picks up an image of the grains growing laterally, and displays the image.

2. A laser crystallization apparatus comprising a crystallizing optical system which irradiates a thin film formed on a substrate with a pulse laser light having a predetermined light intensity distribution to melt and to crystallize the thin film wherein a solidliquid interface being moved laterally immediately after the pulse laser light irradiation, the apparatus comprising:
   an illumination light source provided out of an optical path of the laser light to emit an observing illumination light which illuminates the thin film;
   an illumination optical system including an annular optical element which provides the optical path of the laser light in a central portion and guides the illumination light from the illumination light source to the thin film along the optical path; and
   an observing optical system which magnifies the illumination light transmitted through the substrate including the thin film, picking up an image of the solid-liquid interface moving laterally, and displays the image.

3. The laser crystallization apparatus according to claim 2, wherein the annular optical element is configured of an annular reflector provided around the optical path of the laser light to reflect and guide the illumination light from the illumination light source to the thin film, and an optical lens.

4. The laser crystallization apparatus according to claim 2, wherein the laser light is a pulse excimer laser light, the crystallizing optical system comprises a homogenizer which homogenizes the laser light and a phase modulating element which modulates a phase of the homogenized laser light to obtain a light having a predetermined light intensity distribution, the laser light transmitted through the phase modulating element irradiates the thin film to melt, and the solid liquid interface moves laterally immediately after the laser light irradiation.

5. The laser crystallization apparatus according to claim 2, wherein the observing optical system comprises:
   a lens which magnifies an image of the thin film formed on the substrate and forms the image on a photoelectric surface;
   a photo detector which multiplies electrons generated at the photoelectric surface and forms a fluorescent image on a fluorescent surface by entering the multiplied electrons;
   an image intensifier which amplifies the fluorescent image from the photo detector to form an intensified image on another fluorescent surface; and
   an imaging device which picks up an image on the fluorescent surface of the image intensifier.

6. The laser crystallization apparatus according to claim 2, further comprising:
   an image processing unit which processes an image detected by the observing optical system; and
   a stage driving section having a function to adjust a position of the substrate on the basis of positional data on the substrate obtained by the image processing unit.

7. The laser crystallization apparatus according to claim 5, wherein the imaging device is a cooled CCD imaging device.

8. The laser crystallization apparatus according to claim 2, wherein the thin film is an amorphous silicon film or polycrystal silicon film.

9. The laser crystallization apparatus according to claim 2, wherein the substrate is a transparent glass substrate, and the thin film is an amorphous silicon film or polycrystal silicon film formed on the glass substrate.

10. A laser crystallization method comprising:
    emitting a pulse laser light having a predetermined light intensity distribution;
    irradiating a thin film formed on a substrate with the pulse laser to melt and to crystallize the thin film wherein a solid-liquid interface being moved laterally immediately after the pulse laser light irradiation;
    illuminating an area irradiated with the laser light with an annular observing illumination light along an optical path of the laser light using an annular optical element provided coaxially around the optical path of the laser light to pass through the laser light inside;
    magnifying and imaging the illumination light transmitted through the thin film and picking up an image of the solid-liquid interface moving laterally; and
    displaying the picked image.

11. The laser crystallization method according to claim 10, wherein the thin film is illuminated with the observing illumination light simultaneously with the irradiation with the laser light onto the thin film or after the irradiation with the laser light onto the thin film.

12. The laser crystallization method according to claim 10, further comprising:
    processing a image data of the thin film;
    computing positional data on the substrate on the basis of results of the image processing; and
    adjusting a position of the substrate on the basis of the positional data.

13. The laser crystallization method according to claim 10, wherein the substrate is a transparent glass substrate, and the thin film is an amorphous silicon film or polycrystal silicon film formed on the glass substrate.

14. A laser crystallization method comprising:
    irradiating a thin film with an energy beam having a predetermined energy distribution to melt the thin film and to crystallize the thin film in a cooling process;
    picking up an image of an area of the thin film irradiated with the energy beam or a back surface of the area;
    converting the picked optical image into an electric signal which varies with time passes; and
    outputting monitoring information from the electric signal for the crystallization, wherein the monitoring information is expanded in a preset first direction.

15. A laser crystallization method comprising:
    irradiating a thin film with an energy beam having a predetermined energy distribution to melt the thin film and to crystallize the thin film in a cooling process;

picking up an image of an area of the thin film irradiated with the energy beam or a back surface of the area; and storing a picked information for the crystallization on a solid-liquid interface moving laterally.

16. A method of manufacturing a thin film transistor, wherein the thin film transistor is formed on a crystallized semiconductor thin film and, in forming the crystallized semiconductor thin film, irradiating a non single crystal semiconductor thin film with an energy beam having a predetermined energy distribution to melt the thin film and to crystallize the thin film in a cooling process, imaging the thin film being melted and crystallized by a streak camera, and crystallizing a preset area in the thin film while monitoring the crystallization.

17. A thin film transistor formed on a semiconductor thin film which is formed by irradiating a non single crystal semiconductor thin film with an energy beam having a predetermined energy distribution to melt the thin film and to crystallize the thin film in a cooling process,
  wherein the crystallized semiconductor thin film having a grain size greater than 5 μm is formed in a preset area in the non single crystal semiconductor thin film while real time monitoring the thin film being melted and crystallized by growing a crystal grain laterally.

18. A display apparatus comprising:
a pair of substrates joined together with a predetermined gap; and
an electro optical substance held in the gap;
wherein an opposing electrode is formed on one of the substrates;
a semiconductor thin film is formed on the other substrate, pixel electrodes and thin film transistors driving the pixel electrodes being formed on the semiconductor thin film;
wherein the semiconductor thin film is crystallized in a preset area of a non-single crystal semiconductor thin film while picking up an image of the non single crystal semiconductor thin film being melted and crystallized and monitoring the crystallization.

* * * * *